US011527376B2

(12) United States Patent
Miller et al.

(10) Patent No.: US 11,527,376 B2
(45) Date of Patent: Dec. 13, 2022

(54) MICRO-ELECTROMECHANICAL SYSTEM DEVICES AND METHODS

(71) Applicant: Kionix, Inc., Ithaca, NY (US)

(72) Inventors: Scott A. Miller, Ithaca, NY (US); Nicole Kerness, Ithaca, NY (US); Randy Phillips, Ithaca, NY (US); Sangtae Park, Ithaca, NY (US); Martin Heller, Kyoto (JP); Mizuho Okada, Ithaca, NY (US); Andrew Hocking, Ithaca, NY (US); Wenting Gu, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 697 days.

(21) Appl. No.: 16/521,682

(22) Filed: Jul. 25, 2019

(65) Prior Publication Data

US 2021/0027965 A1 Jan. 28, 2021

(51) Int. Cl.
*B81B 3/00* (2006.01)
*H01H 59/00* (2006.01)

(52) U.S. Cl.
CPC ....... *H01H 59/0009* (2013.01); *B81B 3/0067* (2013.01); *B81B 2201/012* (2013.01); *B81B 2203/019* (2013.01); *B81B 2203/0315* (2013.01)

(58) Field of Classification Search
CPC .................................................. B81B 3/0067
See application file for complete search history.

(56) References Cited

U.S. PATENT DOCUMENTS

| | | |
|---|---|---|
| 5,374,564 A | 12/1994 | Bruel |
| 6,239,473 B1 | 5/2001 | Adams et al. |
| 6,626,039 B1 | 9/2003 | Adams et al. |
| 7,430,909 B2 | 10/2008 | Adams et al. |
| 8,319,254 B2 | 11/2012 | Adams et al. |
| 8,853,803 B2 | 10/2014 | Adams et al. |
| 10,167,191 B2 | 1/2019 | Heller et al. |
| 2007/0048888 A1* | 3/2007 | Christenson ......... G01P 15/125 438/48 |
| 2012/0205753 A1* | 8/2012 | Adams ................. B81B 3/0008 438/52 |

OTHER PUBLICATIONS

"Electrical Connection to a Micro Electro-Mechanical System," U.S. Appl. No. 16/243,671, filed Jan. 9, 2019.

* cited by examiner

*Primary Examiner* — Moazzam Hossain
(74) *Attorney, Agent, or Firm* — Sterne, Kessler, Goldstein & Fox P.L.L.C.

(57) ABSTRACT

A micro-electromechanical system (MEMS) device includes a substrate and a beam suspended relative to a surface of the substrate. The substrate includes a buried insulator layer and a cavity. The beam includes a first portion and a second portion that are separated by an isolation joint. The cavity separates the surface of the substrate from the beam.

20 Claims, 34 Drawing Sheets

MICRO-ELECTROMECHANICAL SYSTEM DEVICES AND METHODS

BACKGROUND

Field

The present disclosure relates to micro-electromechanical system (MEMS) devices and methods, for example, MEMS devices on semiconductor-on-insulator (SOI) substrates.

Background

A microelectromechanical system (MEMS) can be fabricated using semiconductor device fabrication technologies. Microelectronic processing techniques reduce MEMS mechanical components down to the scale of microelectronics. The mechanical sensor elements and their associated signal processing electronics of a MEMS can be integrated onto a single chip in a common manufacturing process. MEMS can be used for various devices including accelerometers, gyroscopes, inertial measurement units, digital micromirrors, optical switching units, pressure sensors, microphones, resonators, or magnetometers. Present commercial applications of MEMS devices are predominantly for pressure and inertial sensing, for example, accelerometers and gyroscopes used in hand-held devices, for example, cell phones and video game controllers. Such MEMS sensing devices can be wire bonded to an Application Specific Integrated Circuit (ASIC). The MEMS sensing device and ASIC can be packaged in a packaging unit typically constructed of three components: (1) a MEMS element that senses a parameter (for example, acceleration); (2) electronics included in an ASIC that transduces the MEMS element's response to the measured parameter into an electronic signal; and (3) a package that houses the MEMS element and the ASIC.

MEMS devices are electrical and mechanical devices that are fabricated at substantially microscopic dimensions utilizing integrated circuit manufacturing techniques.

For example, a MEMS device that is an accelerometer can detect when the cell phone experiences acceleration such as when the phone is rotated from a portrait orientation to a landscape orientation. Such a inertial sensing MEMS device can include a case or substrate, a mass resiliently held within the case, and a deflection sensor for measuring relative motion between the case and the mass. When an acceleration is experienced, the mass moves relative to the case, and the sensor measures the deflection. In most cases, the acceleration is directly proportional to the amplitude of the deflection. Processing steps have been developed to make a MEMS device having such a mass and deflection sensor. When a MEMS device is constructed using such processes, silicon beams coated with silicon dioxide on three sides can be formed. These beams can have an isolation joint that moves with the rest of the structure. These isolation joints enable multiple electrical signals to be routed to multiple places within a device and applied to multiple electrical components such as sensors and actuators.

MEMS devices can have isolation joints that can better withstand mechanical shocks and that reduce the risk of interconnect damage. However, MEMS devices can be susceptible to failure (e.g., immobility) and isolation joint damage, and can require numerous fabrication processing steps.

Accordingly, there is need for improved MEMS devices and fabrication methods that can better withstand mechanical shocks, reduce the risk of device failure and isolation joint damage, and reduce the overall number of fabrication processing steps.

SUMMARY

In some embodiments, a micro-electromechanical system (MEMS) device includes a substrate and a beam suspended relative to a surface of the substrate. The substrate includes a buried insulator layer and a cavity. The beam includes a first portion and a second portion that are separated by an isolation joint. The cavity separates the surface of the substrate from the beam.

In some embodiments, the buried insulator layer is configured to define the surface of the substrate forming the cavity.

In some embodiments, the substrate further includes a second buried insulator layer. In some embodiments, the second buried insulator is configured to define a depth of the isolation joint in the cavity. In some embodiments, the buried insulator layer and the second buried insulator layer define the cavity.

In some embodiments, the buried insulator layer is configured to define a depth of the isolation joint in the cavity.

In some embodiments, the cavity is a pre-etched cavity. In some embodiments, the pre-etched cavity is disposed below the buried insulator layer. In some embodiments, the pre-etched cavity includes a plurality of depths.

In some embodiments, the first and second portions each include a semiconductor and a dielectric layer. In some embodiments, an electrically conductive trace is mechanically coupled to the beam and electrically coupled to the semiconductor of the second portion but not the semiconductor of the first portion.

In some embodiments, the MEMS device further includes a second beam suspended relative to the surface of the substrate. In some embodiments, the second beam includes a second dielectric layer configured to promote curvature of the second beam.

In some embodiments, the MEMS device further includes a third beam suspended relative to the surface of the substrate. In some embodiments, the second beam is configured to move relative to the third beam in response to an acceleration along an axis perpendicular to the surface of the substrate.

In some embodiments, a handheld device includes a micro-electromechanical system (MEMS) device. The MEMS device includes a substrate and a beam suspended relative to a surface of the substrate. The substrate includes a buried insulator layer and a cavity. The beam includes a first portion and a second portion that are separated by an isolation joint. The cavity separates the surface of the substrate from the beam.

In some embodiments, the buried insulator layer is configured to define the surface of the substrate forming the cavity. In some embodiments, the substrate includes a second buried insulator layer. In some embodiments, the cavity is a pre-etched cavity.

In some embodiments, a method of making a micro-electromechanical system (MEMS) device includes forming a profile of a beam in a substrate including a buried insulator layer. The beam includes a first portion and a second portion that are separated by an isolation joint. The method further includes forming a cavity in the substrate configured to release the beam from the substrate. The cavity is defined by the buried insulator layer. The method further includes removing the buried insulator layer from the cavity.

In some embodiments, the substrate includes a second buried insulator layer. In some embodiments, the cavity is further defined by the second buried insulator layer. In some embodiments, the removing further includes removing the second buried insulator layer. In some embodiments, the forming the cavity includes a pre-etched cavity.

Further features and advantages of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the disclosure and to enable a person skilled in the relevant art(s) to make and use the disclosure.

Figure 1:
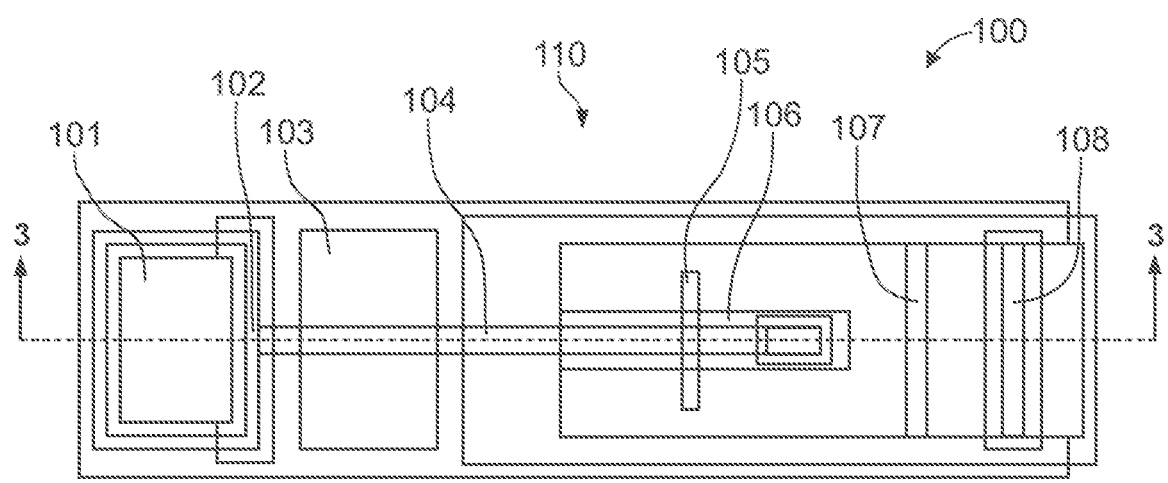
FIG. 1 is a schematic top view illustration of a MEMS device, according to an exemplary embodiment.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" as used herein indicates the value of a given quantity that can vary based on a particular technology. Based on the particular technology, the term "about" or "substantially" can indicate a value of a given quantity that varies within, for example, 1-15% of the value (e.g., ±1%, ±2%, ±5%, ±10%, or ±15% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/ or instructions may be described herein as performing certain actions. However, it should be appreciated that such descriptions are merely for convenience and that such actions in fact result from computing devices, processors, controllers, or other devices executing the firmware, software, routines, instructions, etc.

Exemplary MEMS Devices On SOI Substrates

As mentioned above, MEMS devices can be susceptible to failure and isolation joint damage, and fabrication methods can require numerous fabrication processing steps. Semiconductor-on-insulator (SOI) substrates (e.g., silicon-on-insulator) can be used in place of conventional semiconductor substrates (e.g., silicon). SOI substrates have a layered semiconductor-insulator-semiconductor (e.g., Si—$SiO_x$—Si) structure, which can reduce the number of fabrication steps and allow for greater precision and control of etching processes, which can in turn reduce device failure and isolation joint damage.

MEMS devices can be susceptible to failure (e.g., immobility, entanglement, interference, etc.) due to large spaces above and, more importantly, below the fabricated MEMS structure, for example, during high-g shock conditions. By utilizing semiconductor-on-insulator (SOI) substrates (e.g., silicon-on-insulator), which include at least one buried insulator layer, etching processes during fabrication of a MEMS device can be controlled for a desired spacing (e.g., cavity). A controlled spacing between movable structures and non-movable structures can be formed and can reduce device failure because the buried insulator layer of the SOI substrate can act as an etch stop. For example, a shallow cavity can be formed beneath movable MEMS structures to allow the movable MEMS structures to move freely but prevent access under or entanglement with non-movable structures.

Further, long or extended isolation joints beneath movable MEMS structures can break or fracture, for example, during high-g shock conditions. By utilizing SOI substrates, a length or depth of an isolation joint can be controlled for a desired length or depth. A controlled depth of an isolation trench for an isolation joint can be formed because a buried insulator layer (e.g., close to the top surface) of the SOI substrate can act as a first etch stop. For example, a shallow isolation joint can be formed beneath movable MEMS structures and reduce breakage or fracture. By utilizing double SOI substrates, which include two separate buried insulator layers, a shallow isolation joint and a shallow cavity can be formed. For example, a controlled depth of an isolation trench for an isolation joint can be formed because a top (first) buried insulator layer of the double SOI substrate can act as a first etch stop, and a controlled spacing between movable structures and non-movable structures can be formed because a lower (second) buried insulator layer can act as a second etch stop.

Moreover, the number of fabrication processing steps can be reduced with SOI substrates. By utilizing, for example, cavity SOI substrates, which include a pre-etched buried cavity, a shallow isolation joint and a shallow cavity can be formed while omitting several processing steps, saving cost and time and increasing throughput. For example, a controlled depth of an isolation trench for an isolation joint can be formed because a buried insulator layer of the cavity SOI substrate can act as an etch stop, and a controlled spacing between movable structures and non-movable structures can be accessed because of the pre-etched buried cavity.

The following methods improve the process of making a MEMS device, and the technical differences and advantages of utilizing SOI substrates will be described. Accordingly, MEMS devices on SOI substrates can better withstand mechanical shocks, reduce the risk of device failure and isolation joint damage, and reduce the overall number of fabrication processing steps, and methods of making such MEMS devices will be described.

FIG. 1 is a top view computer-aided design (CAD) drawing used to create MEMS device 100, according to an embodiment. MEMS device 100 can include a metal bond pad 101 and a metal trace 104. The metal bond pad 101 can be connected to the metal trace 104 at connection 102. MEMS device 100 can also include a metal seal ring surface 103 for coupling with a lid (not shown). Metal trace 104 can run underneath the metal seal ring surface 103. MEMS device 100 can have one or more beams, for example, beams 106, 107, and 108. Beams 106, 107, and 108 can be used in inertial sensing MEMS devices.

Figure 2:
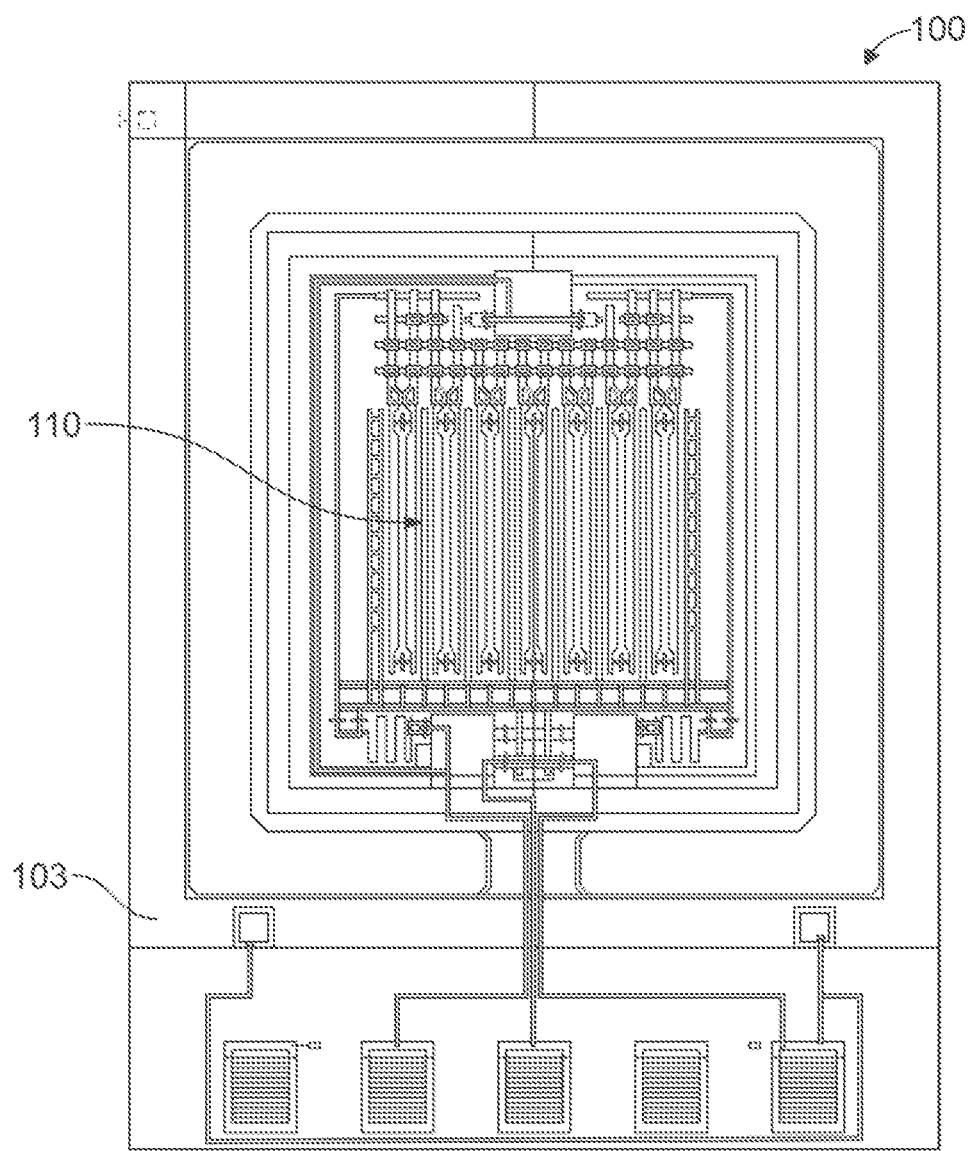
FIG. 2 is a schematic top view illustration of a MEMS device, according to an exemplary embodiment.

FIG. 2 is a top view of MEMS device 100, according to another embodiment. In this embodiment, metal seal ring surface 103 is continuous—metal seal ring surface 103 completely surrounds the entire beam structure 110, which can include one or more beams. Accordingly, a continuous, uninterrupted seal can be formed about beam structure 110.

The MEMS devices 100 illustrated in FIGS. 1 and 2 are embodiments presented herein for illustrative purposes only. The disclosure is not limited to the specific embodiments illustrated in FIGS. 1 and 2. For example, MEMS device 100 can have a beam structure 110 comprising any number of beams and beam configurations, and multiple beams can have isolation joints. Further, MEMS devices 100 illustrated in FIGS. 1 and 2 can include an SOI substrate, a double SOI substrate, or a cavity SOI substrate.

FIGS. 3 through 23, which illustrate schematic cross-sectional views of MEMS device 100 along line 3-3 as shown in FIG. 1, disclose embodiments of making MEMS device 100. In some embodiments, FIGS. 3 through 23 correspond to fabrication processing Steps A through U, respectively.

Figure 3:
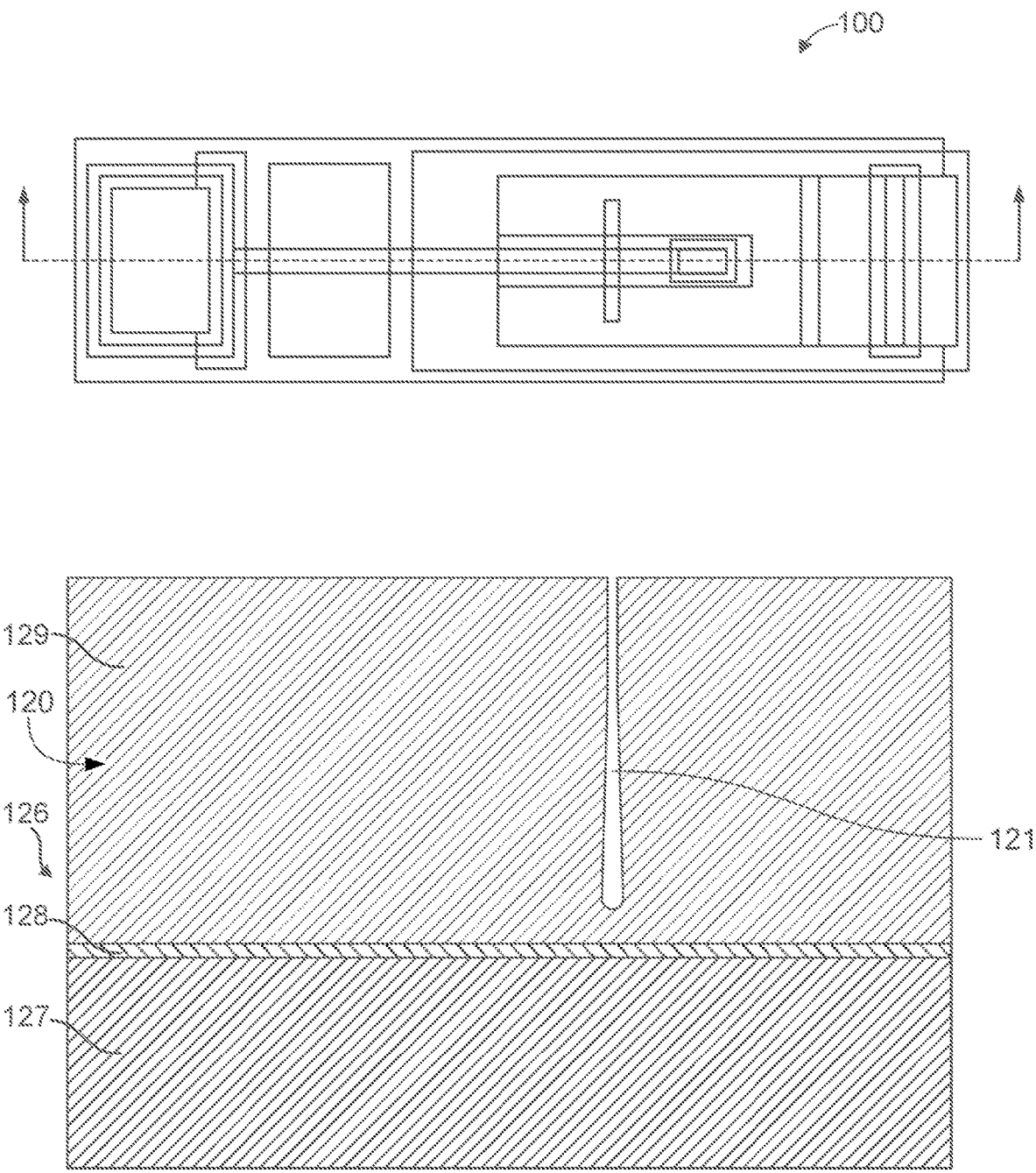
FIGS. 3-23 are schematic top view and cross-sectional view illustrations of an exemplary method of making a MEMS device on a SOI substrate, according to exemplary embodiments.

In FIG. 3 (Step A), an isolation trench 121 can be formed in a substrate 120. Substrate 120 can be a semiconductor-on-insulator (SOI) substrate (e.g., silicon-on-insulator), a double SOI substrate, a cavity SOI substrate, or any combination thereof. For example, as shown in FIGS. 3 through 23, substrate 120 can be SOI substrate 126. For example, as shown in FIGS. 24 through 30, substrate 120 can be double SOI substrate 126'. For example, as shown in FIGS. 31 through 36, substrate 120 can be cavity SOI substrate 126". Substrate 120 can be, for example, a silicon wafer that is boron doped to 5 mΩ-cm with a <100> crystallographic orientation. Doping levels, resistivity, and crystallographic orientation, however, can vary.

Figure 20:
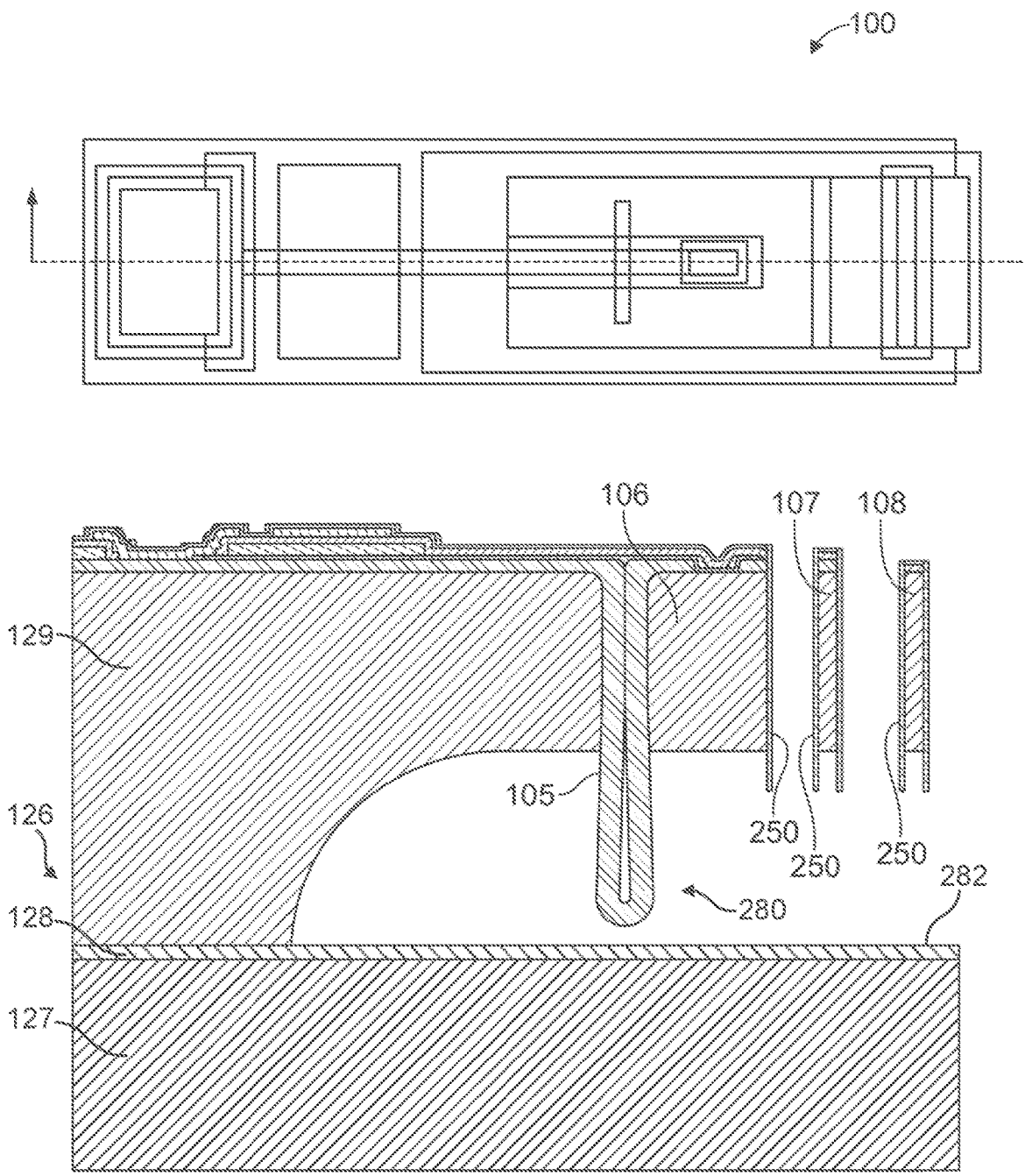

SOI substrate 126 can include a buried insulator layer 128, for example, silicon dioxide, disposed between an active (top) layer 129 and a bulk (bottom) layer 127. For example, SOI substrate 126 can undergo ion implantation (e.g., oxygen ions) and can be thermally oxidized or annealed to form buried insulator layer 128 (e.g., separation by implantation of oxygen (SIMOX) process), for example, a thickness of about 50 nm to about 500 nm; however, any other suitable method can be used such as chemical vapor deposition (CVD), wafer bonding, seed methods, SMART CUT™ (Soitec), NANOCLEAVE® (Silicon Genesis), or ELTRAN® (Canon). In some embodiments, buried insulator layer 128 can be configured to define a surface of SOI substrate 126, for example, floor 282 adjacent cavity 280. For example, as shown in FIG. 20, buried insulator layer 128 can define floor 282 forming cavity 280.

In an embodiment, isolation trench 121 can be formed using any suitable lithographic technique, for example, photolithography, electron-beam lithography, imprint lithography, and any other suitable form of lithography. A resist (not shown) can be spun onto SOI substrate 126, and an isolation trench pattern can be defined in the resist and the oxide mask layer (if present) using, for example, a plasma dry etch in $CHF_3$ and $O_2$. The isolation trench pattern can be transferred to SOI substrate 126 to form isolation trench 121 where isolation joint 105 will be formed. In one embodiment, a silicon etch chamber running the Bosch process that alternates between etching (for example, $SF_6$ etching) and passivation (for example, using $C_4F_8$) can be used to form the isolation trench 121. After SOI substrate 126 is etched, the resist and oxide mask layer can be removed using any suitable technique. Isolation trench 121 can have any suitable profile, for example, a reentrant profile in which the top is narrower than the bottom, such as illustrated in FIG. 3. An embodiment includes a profile that monotonically increases in width. As shown in FIG. 3, isolation trench 121 can be disposed above buried insulator layer 128. In some embodiments, isolation trench 121 can extend to buried insulator layer 128.

Figure 4:
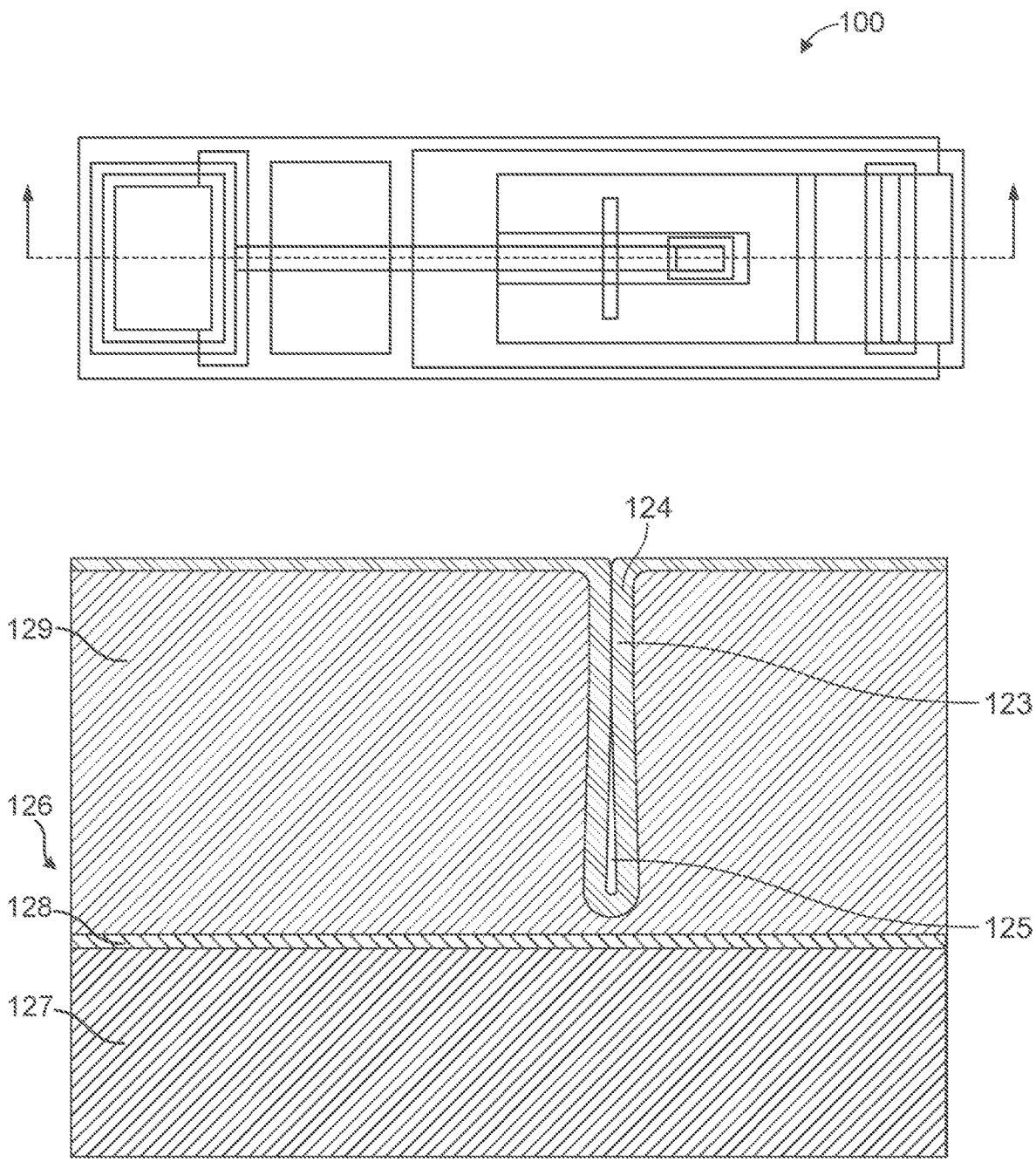

As illustrated in FIG. 4 (Step B), isolation trench 121 can be filled with a first dielectric layer 123, for example, silicon dioxide or any other suitable dielectric material. In an embodiment, SOI substrate 126 can include silicon and top layer 129 can be thermally oxidized to form a layer of silicon dioxide. Top layer 129 can be oxidized at about 1100° C. to about 1200° C. with wet oxidation to form silicon dioxide having a thickness of about 1.5 μm to about 2.5 μm. An opening 124 of isolation trench 121 can be sealed, and a void 125 can remain after the oxidization process.

Optionally, any divots in first dielectric layer 123 at opening 124 can be planarized. For example, a resist-based planarization can be used to reduce or eliminate a divot at opening 124. During such a planarization step, first dielectric layer 123 on top of top layer 129 of SOI substrate 126 can be reduced to a thickness of about 0.5 µm to about 1.5 µm. However, this thickness can vary based on the particular MEMS device being fabricated. Although a resist planarization is described, other suitable planarization techniques can be used, for example, chemical mechanical polishing (CMP).

Figure 5:
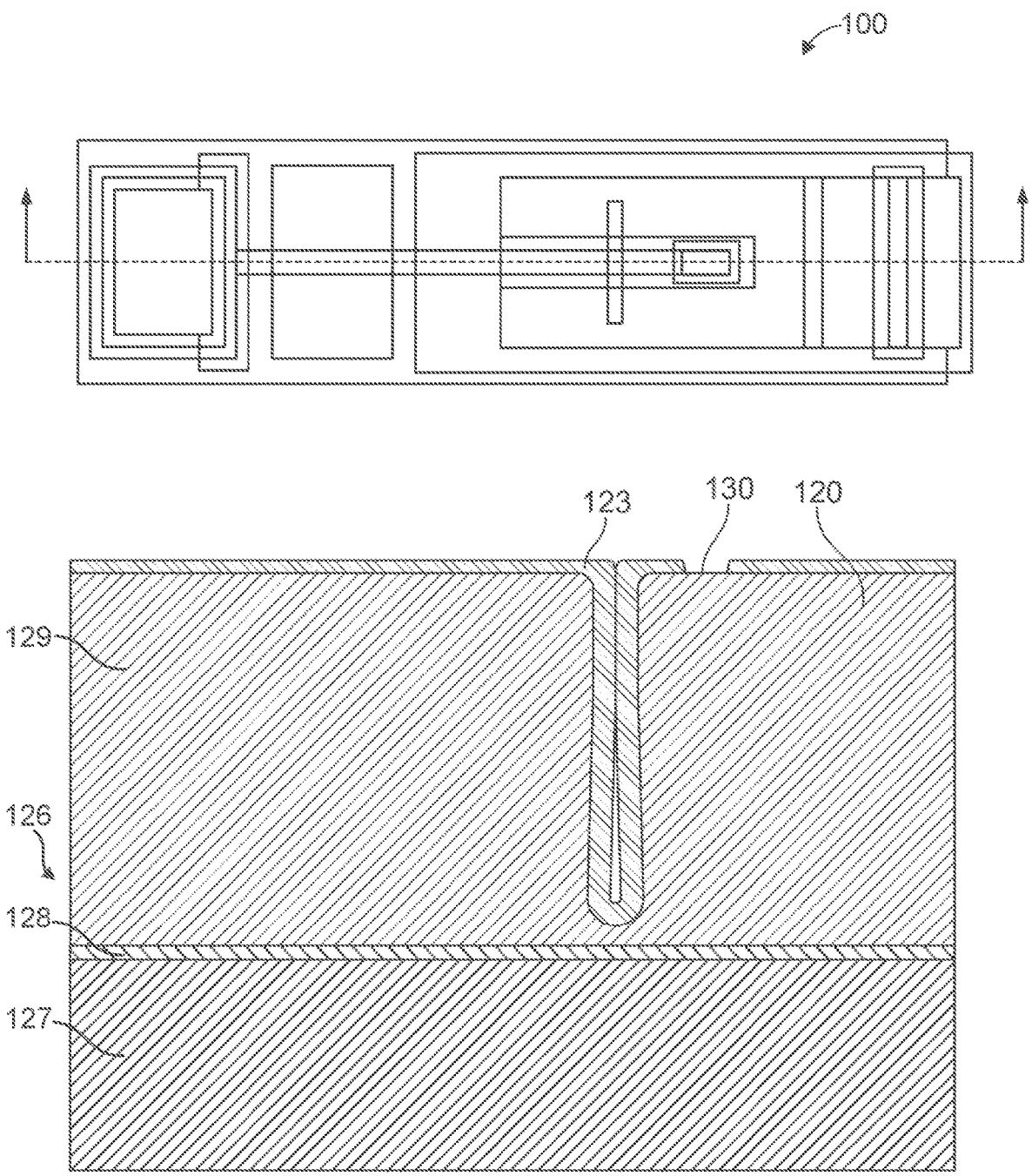

As illustrated in FIG. 5 (Step C), an opening or via 130 can be formed in first dielectric layer 123. Any suitable lithographic technique, for example, photolithography, and dry etching can be used to define via 130 in first dielectric layer 123. Via 130 can be used to electrically couple top layer 129 to a subsequent metal layer. Optionally, top layer 129 exposed at via 130 can be prepared for such an electrical coupling by forming a layer of oxide on the exposed surface, for example, by thermally and dry oxidizing SOI substrate 126 at about 850° C. to about 950° C. to form about 10 nm of oxide. This oxide layer can then be dipped in liquid hydrogen fluoride (HF) and removed prior to forming a metal layer over the top of the exposed surface of top layer 129.

Figure 6:
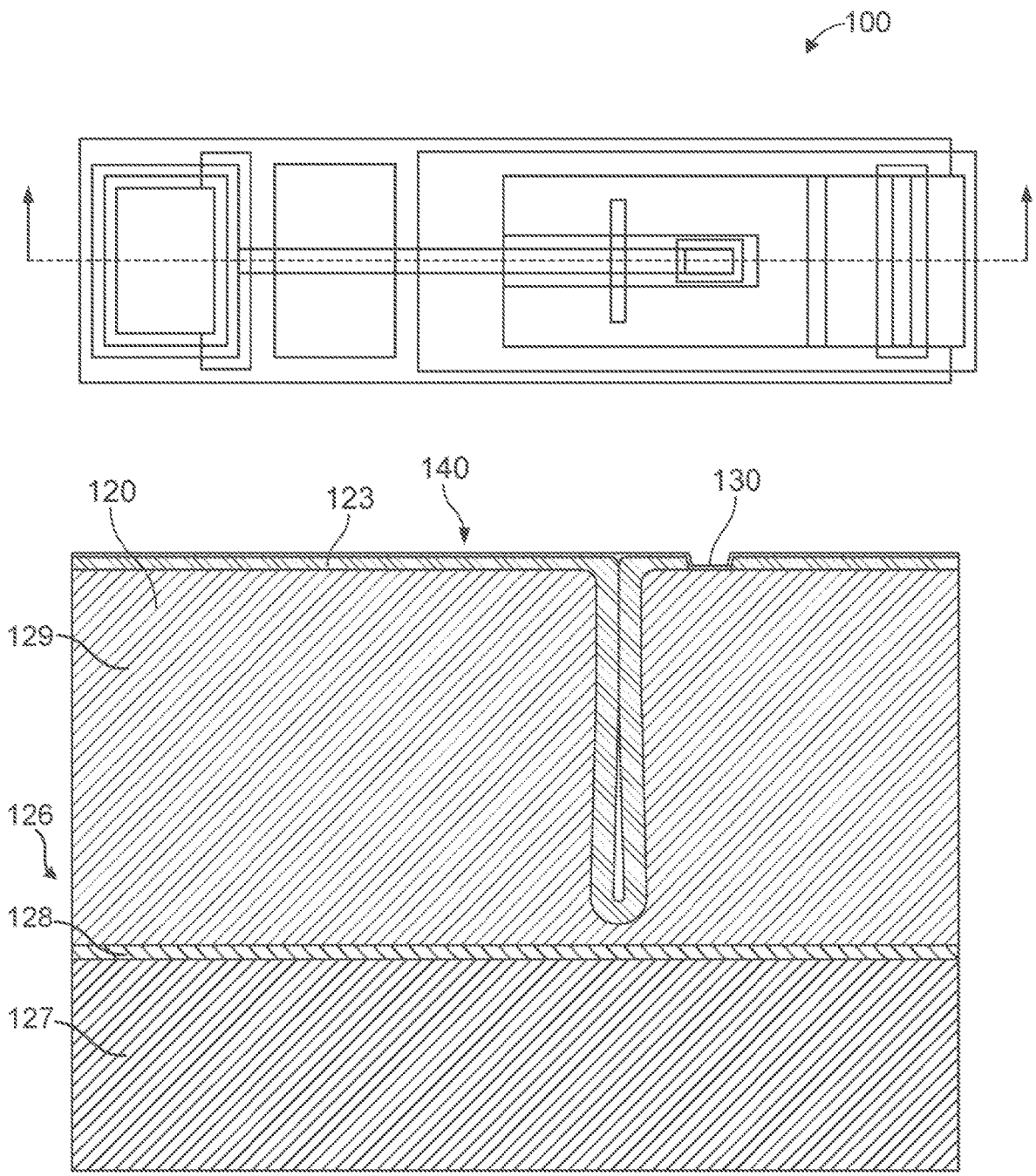

Subsequently, as illustrated in FIG. 6 (Step D), a first metal layer 140 can be formed. In an embodiment, first metal layer 140 can have a thickness of about 250 nm to about 350 nm. In other embodiments, the thickness of first metal layer 140 can be formed as thin as possible without compromising the structural integrity. First metal layer 140 can be aluminum, titanium nitride, aluminum-silicon, aluminum-silicon-copper, or any other suitable metal or alloy.

Figure 7:
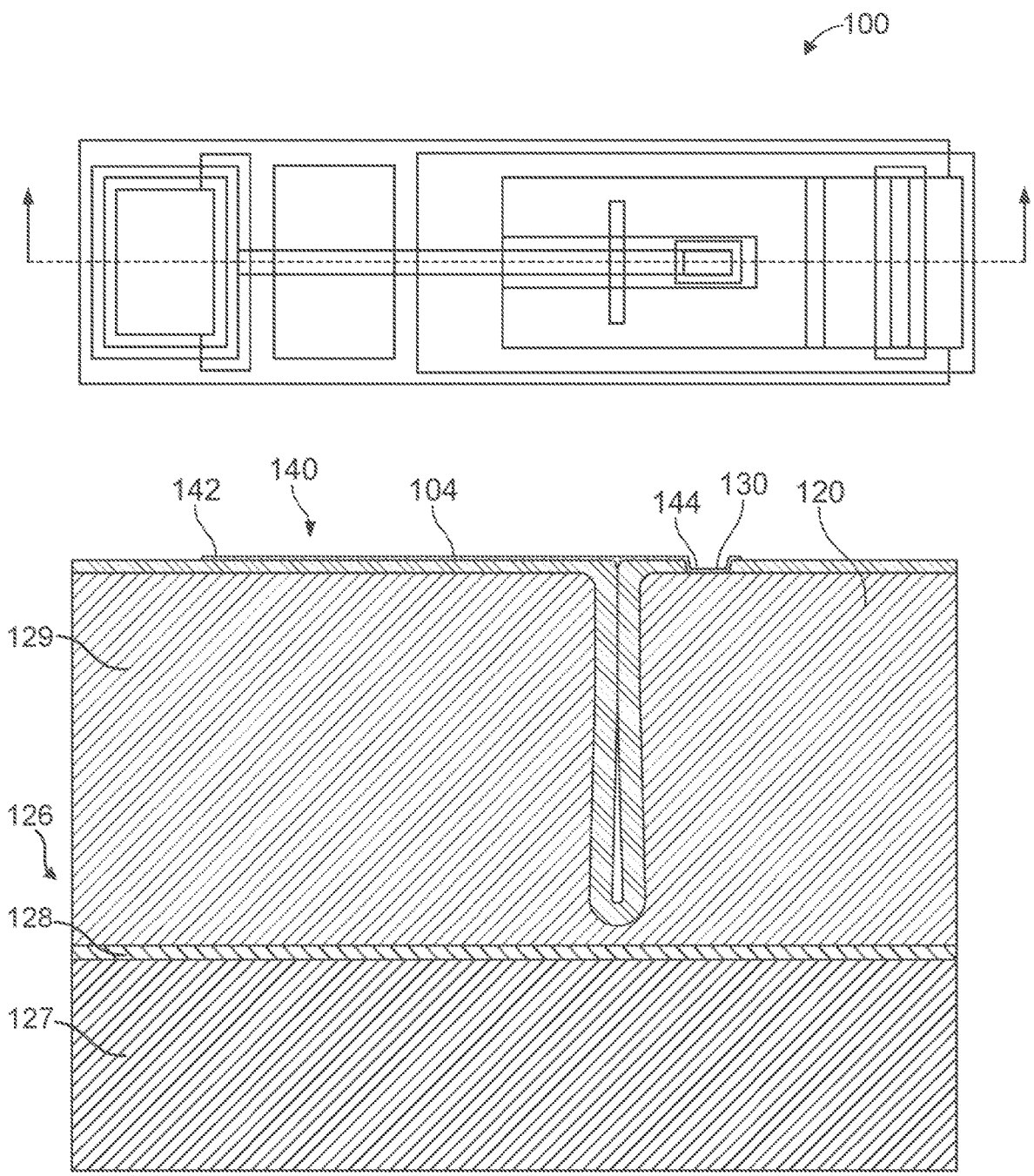
Figure 14:
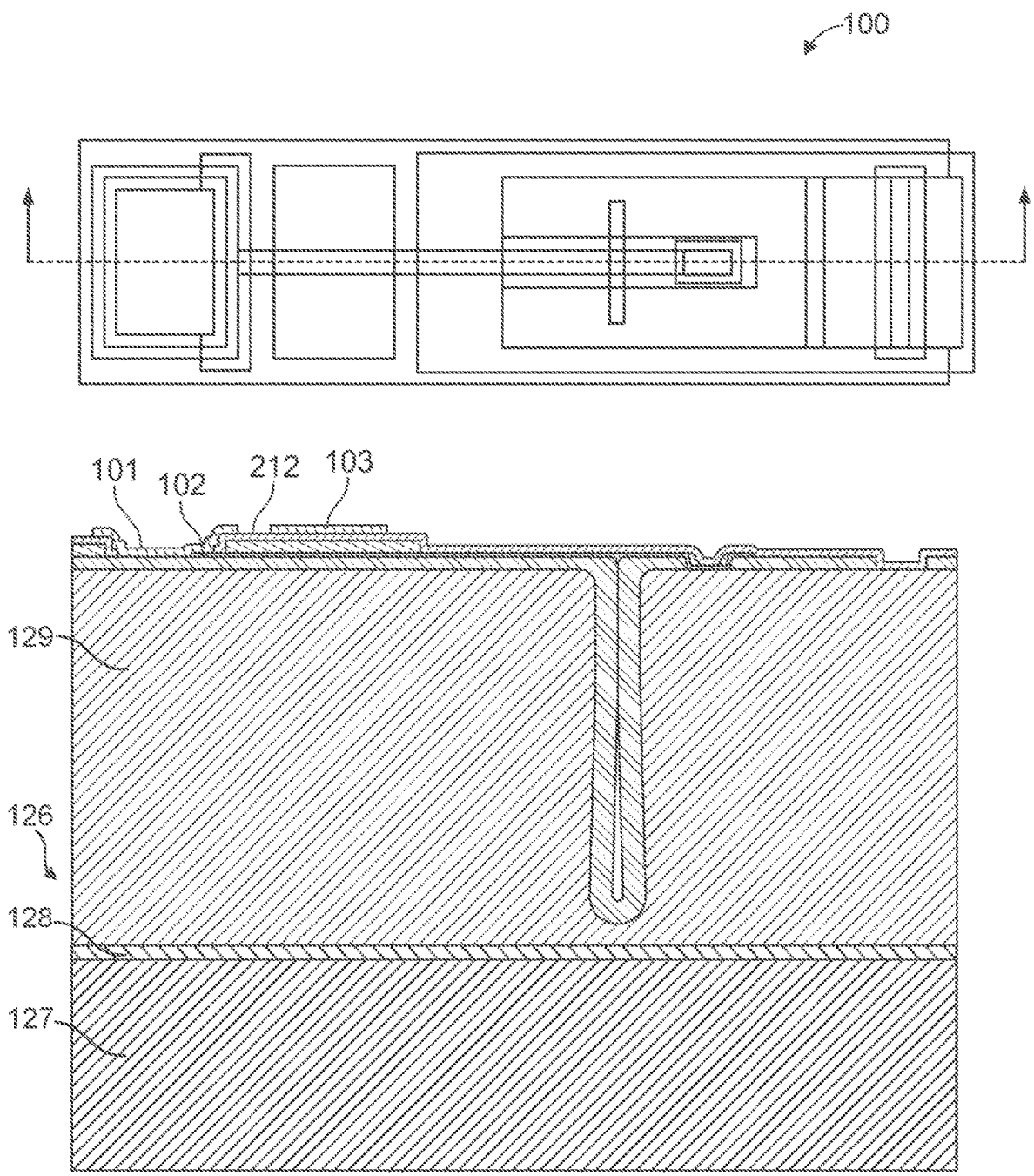

In an embodiment, first metal layer 140 can be patterned to define the metal trace 104 that serves as an interconnect layer on MEMS device 100 that runs along beam 106, as illustrated in FIG. 7 (Step E). Metal trace 104 can include a proximal end portion 142 and a distal end portion 144. Proximal end portion 142 can form connection 102 with the metal bond pad 101, as illustrated in FIG. 14 and described below. Distal end portion 144 can be electrically coupled to a distal portion of substrate 120 through via 130. Metal trace 104 can be formed using any suitable lithographic technique, for example, photolithography, and metal etching.

Figure 8:
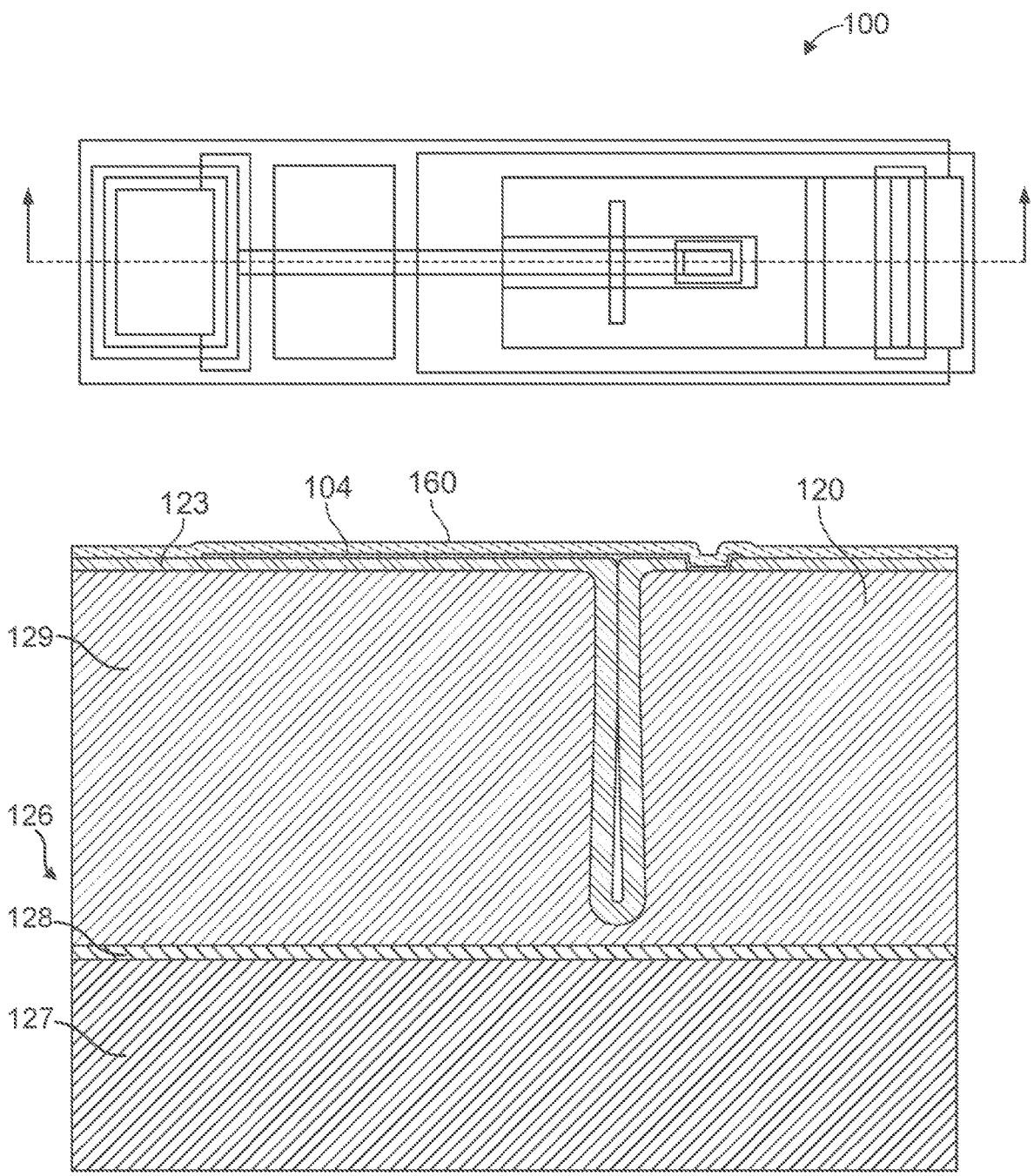

As shown in FIG. 8 (Step F), a dielectric passivation layer 160 can be formed, covering metal trace 104 and first dielectric layer 123 on top layer 129. Dielectric passivation layer 160 can protect metal trace 104 during subsequent etching steps. In an embodiment, dielectric passivation layer 160 can be a tetraethoxysilane (TEOS) oxide that is deposited at a high power to promote a higher density film, which can decrease susceptibility to subsequent etching steps. In one example, a TEOS oxide can be deposited using an AMAT P5000 deposition tool running at about 400° C. with about 1.1 kW of RF power, at about 8.2 mTorr pressure, with flow rates of about 1000 mg/min of TEOS, about 1000 sccm of $O_2$, and about 1000 sccm of He. Dielectric passivation layer 160, however, can be any suitable dielectric material.

Figure 9:
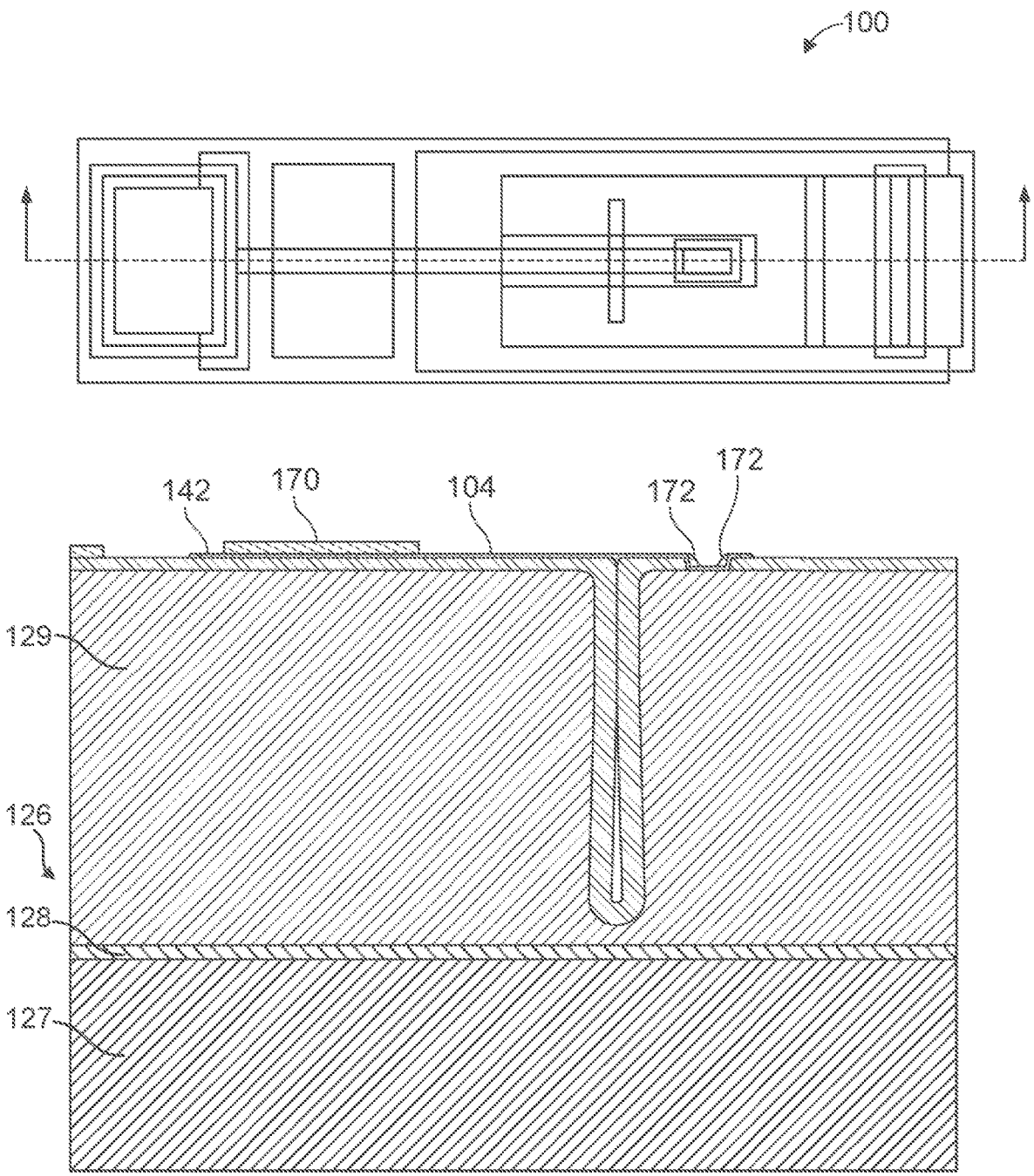

As shown in FIG. 9 (Step G), portions of dielectric passivation layer 160 can be removed. For example, if dielectric passivation layer 160 is an oxide, dielectric passivation layer 160 can be patterned using any suitable lithographic technique, for example, photolithography, and etched with dry oxide etching. In an embodiment, patterned dielectric passivation layer 160 can include a base 170 for the metal seal ring surface 103 (e.g., shown in FIG. 14) and remnants 172 that persist adjacent to topography changes created by metal trace 104. In one example, dielectric passivation layer 160 is patterned and etched to expose proximal end portion 142 of metal trace 104 from underneath dielectric passivation layer 160.

In an embodiment, any residue formed on top layer 129 from etching dielectric passivation layer 160 can be removed. For example, during a dry etch, residual polymers can form on vertical surfaces, and standard techniques for removing the resist used during the dry etch cannot remove all of the residual polymers. Such polymers can produce unwanted features such as inhibition of subsequent etching, variability in etch rates, and irregular sheets of residual material that can peel off and obstruct beam movement. In one example, the residual polymers can be removed using REZI-78 residue removers. In one embodiment, the removal step can be followed by a spin-rinse-dry cycle.

Figure 10:
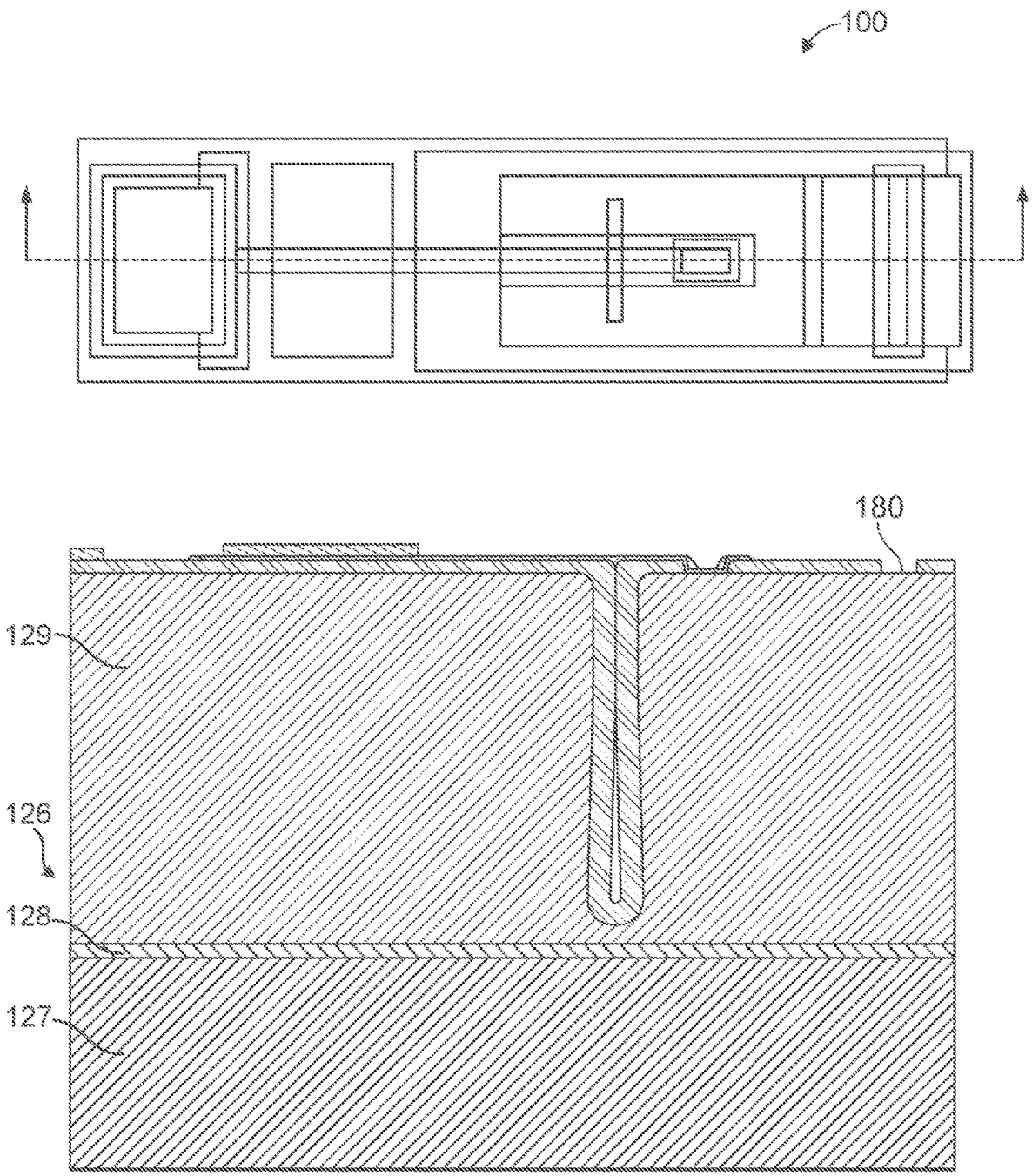

Next, as shown in FIG. 10 (Step H), an opening 180 can be formed in first dielectric layer 123 on a distal side of SOI substrate 126. Opening 180 can be formed using any suitable lithographic technique, for example, photolithography, and dry oxide etching. In one embodiment, opening 180 corresponds to a top of a beam, for example, beam 108 (e.g., shown in FIG. 16). In an embodiment, any residue formed on top layer 129 while etching first dielectric layer 123 can removed.

Figure 11:
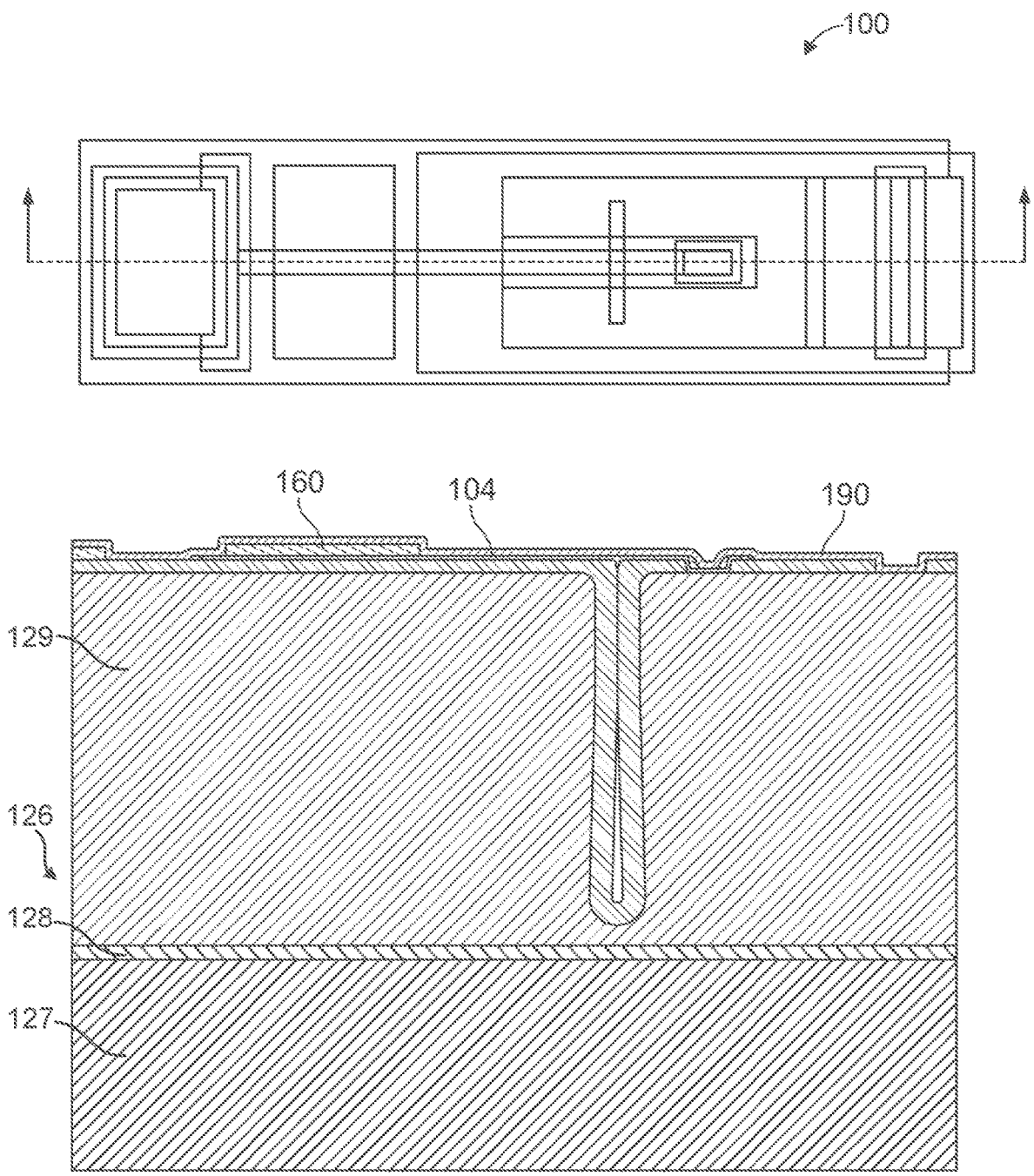

A second dielectric passivation layer 190 can be formed, as shown in FIG. 11 (Step I). For example, second dielectric passivation layer 190 can be a TEOS oxide having a thickness of about 450 nm to about 550 nm. The TEOS oxide can be deposited at a lower power than that for dielectric passivation layer 160, for example, 900 W of RF power, so that second dielectric passivation layer 190 can be more susceptible to subsequent etching steps than dielectric passivation layer 160. Although second dielectric passivation layer 190 is described above as a TEOS oxide, second dielectric passivation layer 190 can be other suitable dielectric materials. Second dielectric passivation layer 190 can be an inter-metal dielectric layer that insulates metal trace 104 from subsequent layers of metal to be formed. Second dielectric passivation layer 190 can also be used as a mask to pattern a beam, such as beam 108 (e.g., shown in FIG. 16).

Figure 12:
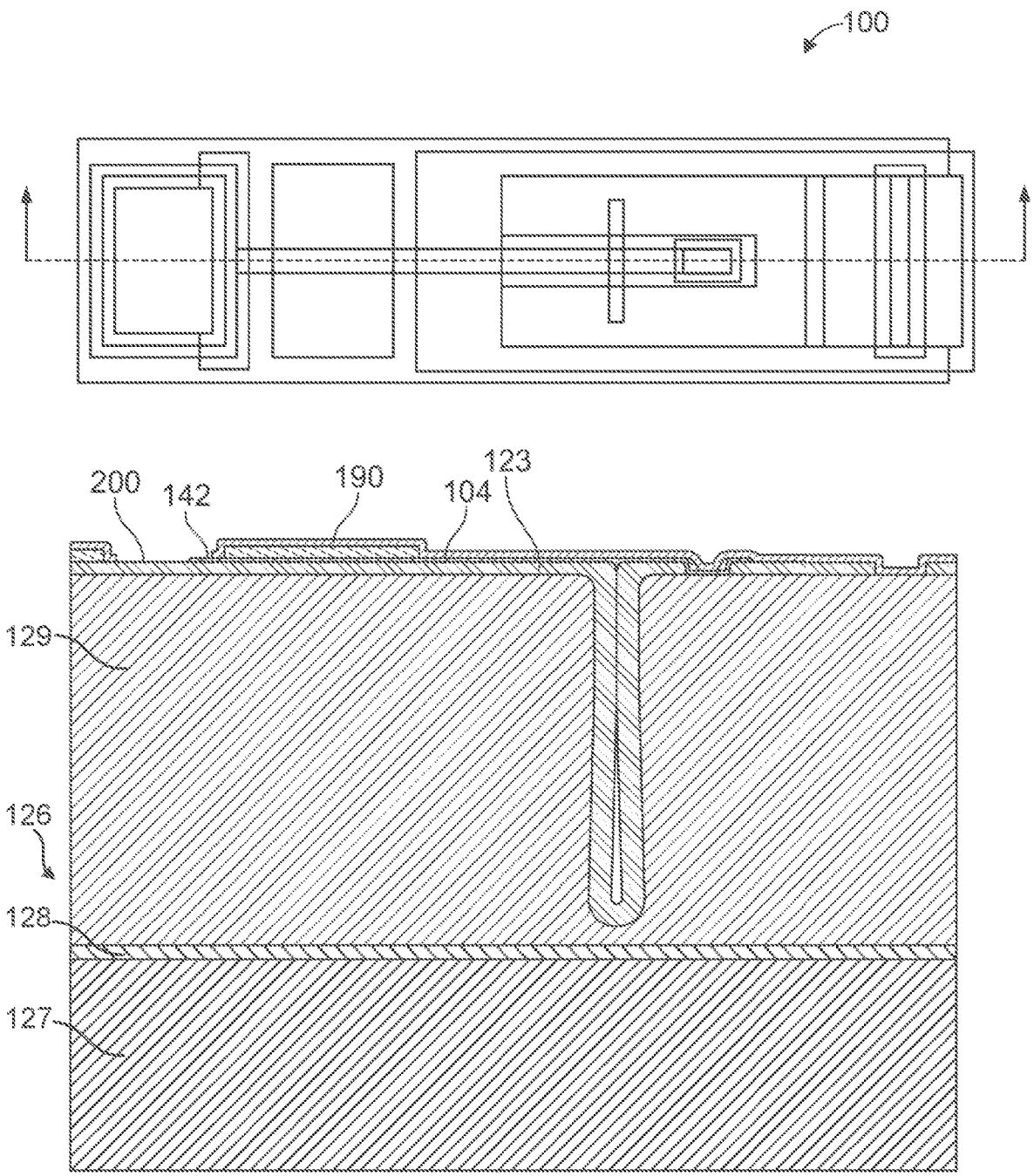

As shown in FIG. 12 (Step J), second dielectric passivation layer 190 can be patterned and etched. In an example, an opening or via 200 can be formed in second dielectric passivation layer 190, exposing a surface of first dielectric layer 123 and proximal end portion 142 of metal trace 104. Any suitable lithographic technique, for example, photolithography, and etching can be used to form via 200. In one embodiment, any residue remaining from etching second dielectric passivation layer 190 can be removed.

Figure 13:
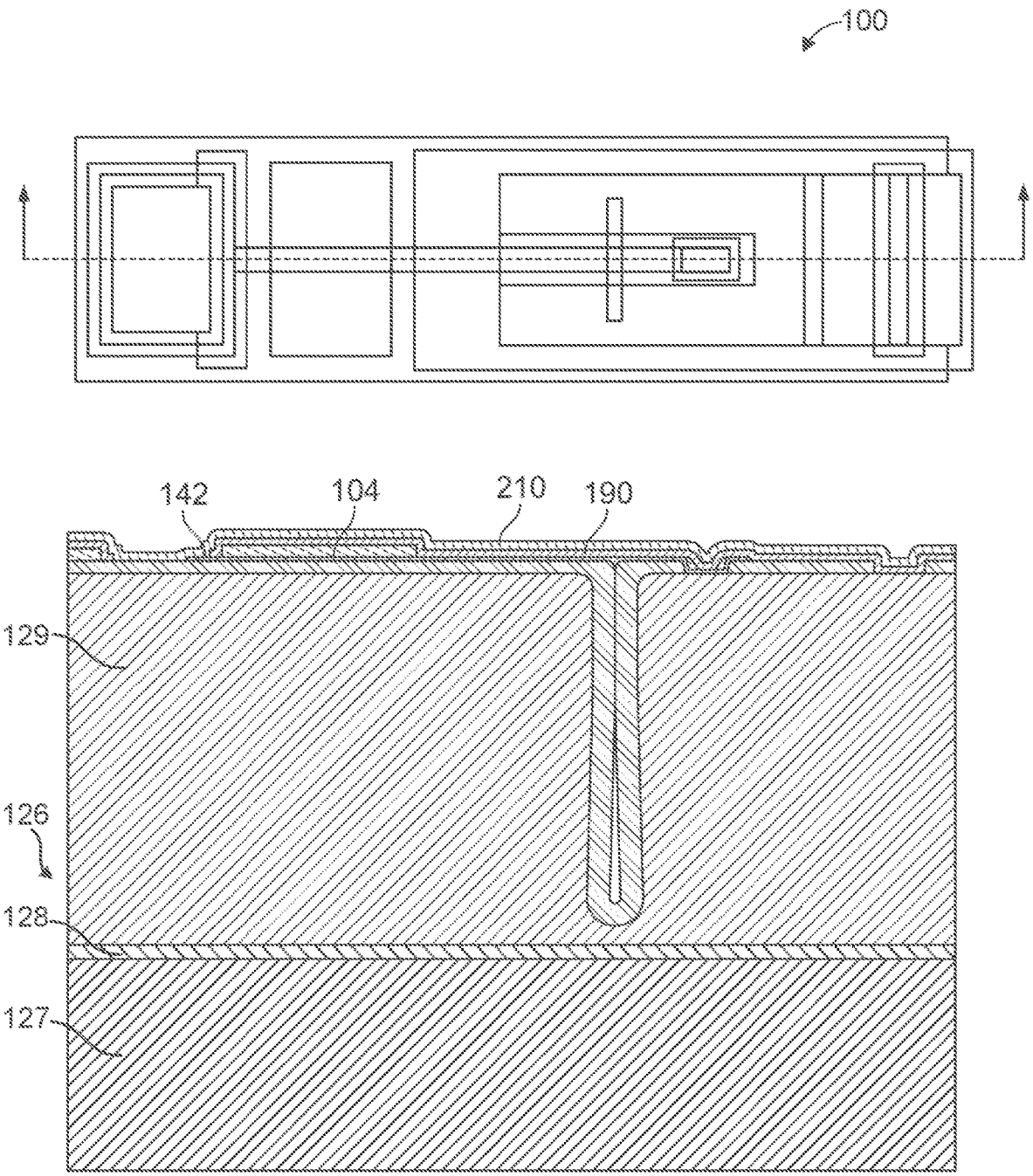

Next, a second metal layer 210 can be formed on top layer 129, as shown in FIG. 13 (Step K). Second dielectric passivation layer 190 can be between second metal layer 210 and metal trace 104, except at exposed proximal end portion 142 of metal trace 104. Second metal layer 210 can be aluminum, titanium nitride, aluminum-silicon, aluminum-silicon-copper, or any other suitable metal or alloy. For example, second metal layer 210 can be pure aluminum having a thickness of about 650 nm to about 750 nm or any other suitable thickness to form metal bond pad 101 and form an interface for sealing with a glass frit.

As shown in FIG. 14 (Step L), second metal layer 210 can be patterned and etched. In one embodiment, a metal bond pad 101 and a metal seal ring surface 103 can be formed. In an embodiment, second metal layer 210 can be patterned such that metal seal ring surface 103 surrounds beam structure 110 of MEMS device 100, creating a continuous seal when coupled to a lid (e.g., shown in FIGS. 22 and 23). In an example, second metal layer 210 can be patterned using any suitable lithographic technique and metal etching, for example, a wet or dry aluminum etching. In an embodiment, an opening or gap 212 can be formed. For example, as shown in FIG. 14, gap 212 can be between metal seal ring surface 103 and connection 102 of metal trace 104 and metal bond pad 101. Gap 212 can allow a lid to be coupled to metal seal ring surface 103 without metal trace 104 or metal bond pad 101 running immediately below the lid, which could disrupt the seal between the lid and the metal seal ring surface 103. This configuration can improve the seal strength.

In an embodiment, first metal layer 140 can form metal trace 104, and second metal layer 210 can form metal bond pad 101 and metal seal ring surface 103. Using two layers of metal, allows metal trace 104 to have a different thickness than metal bond pad 101 and metal seal ring surface 103. For example, in an embodiment, the thickness of first metal layer 140 can be smaller than the thickness of the second metal layer 210. Accordingly, metal trace 104 that runs along a beam can be thin, which minimizes the influence of metal trace 104 on a beam despite the amount of plastic deformation that occurs from bending caused by an applied force or the fabrication process. In contrast, metal bond pad 101 and metal seal ring surface 103 can be thick, which can promote a durable frit seal with a lid at metal seal ring surface 103 and electrical connections at metal bond pad 101.

Figure 15:
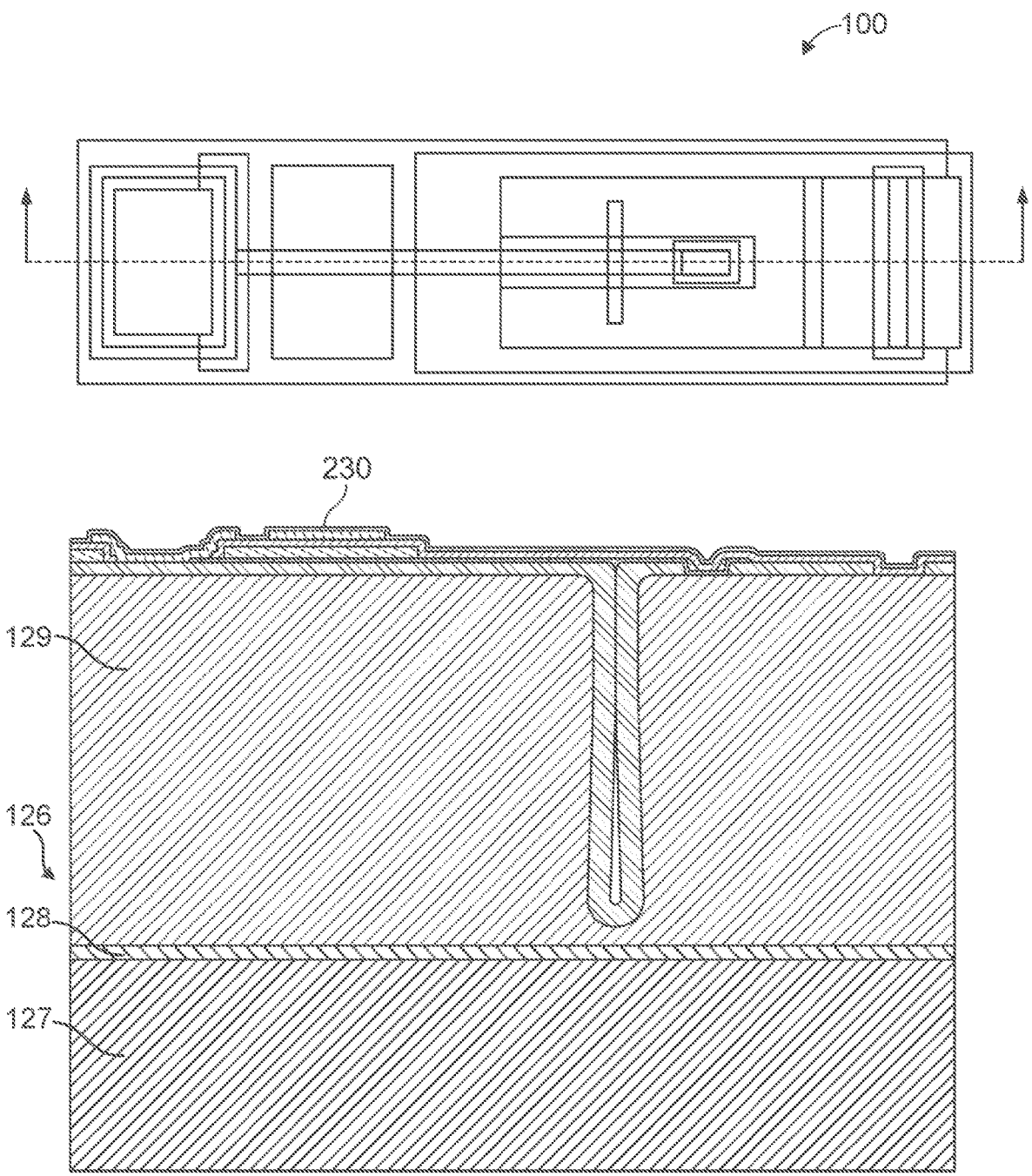

To protect metal bond pad 101 and metal seal ring surface 103 from subsequent etching, a third dielectric passivation layer 230 can be formed on SOI substrate 126, covering at least metal bond pad 101 and metal seal ring surface 103, as shown in FIG. 15 (Step M). In an embodiment, third dielectric passivation layer 230 can be a TEOS oxide deposited to a thickness of about 150 nm to about 250 nm. In one embodiment, the TEOS oxide can be deposited at low power, for example, about 900 W of RF power, to promote a subsequent etching step.

Figure 16:
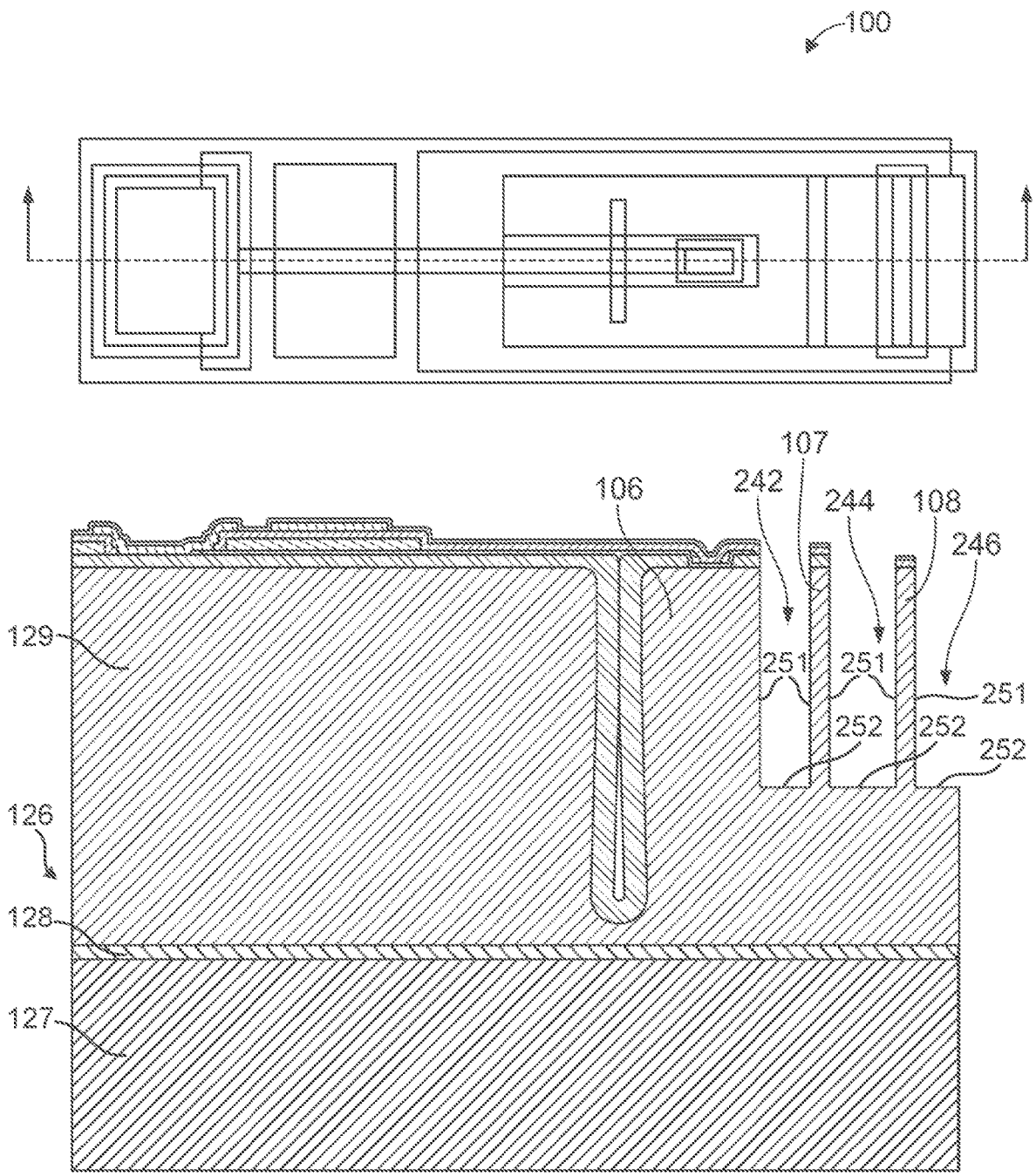

As shown in FIG. 16 (Step N), top layer 129 of SOI substrate 126 can be patterned and etched to create at least one trench that can define a profile of a beam. For example, trenches 242, 244, and 246 can be formed in top layer 129 to define the profiles of beams 106, 107, and 108. In one embodiment, trenches 242, 244, and 246 can be formed by using any suitable lithographic technique, for example, photolithography, and a series of dry etching steps that etch third dielectric passivation layer 230, second dielectric passivation layer 190, first dielectric layer 123, and top layer 129. In one example, a standard plasma dry etch using $CHF_3$ and $O_2$ can be used to etch third dielectric passivation layer 230, second dielectric passivation layer 190, and first dielectric layer 123. In an embodiment, top layer 129 can be etched using a silicon etch chamber running the Bosch process. In another embodiment, metal trace 104 can be etched if metal trace 104 is within the masking stack. In another embodiment, any residue remaining from etching third dielectric passivation layer 230, second dielectric passivation layer 190, first dielectric layer 123, and top layer 129 can be removed.

Figure 17:
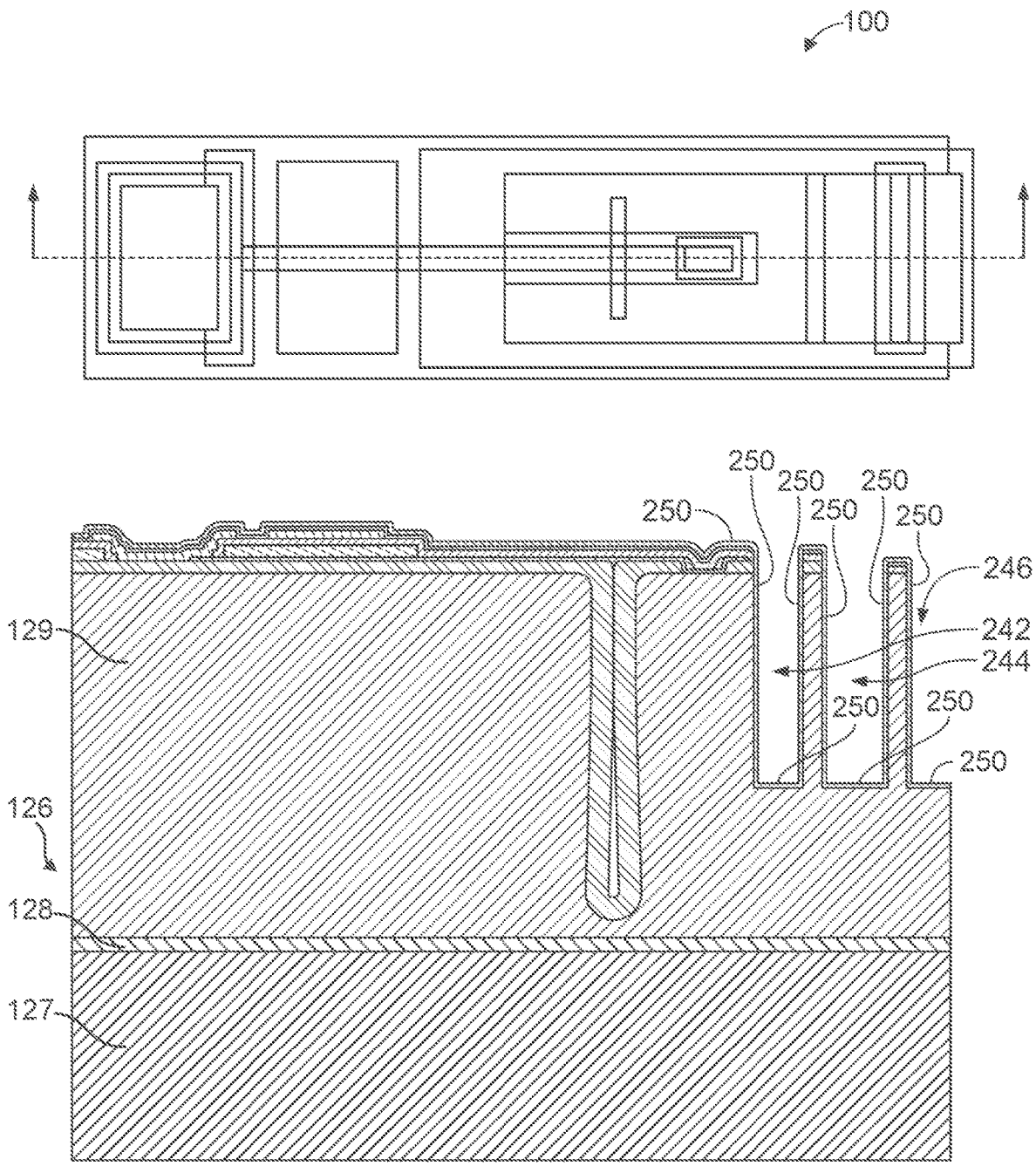

FIG. 17 (Step O) shows an embodiment in which a second dielectric layer 250 can be formed on top layer 129, covering at least sidewalls 251 and floors 252 of trenches 242, 244, and 246, respectively, formed in top layer 129. Second dielectric layer 250 can be an oxide. In one embodiment, the oxide is a TEOS oxide deposited at a low power, for example, about 1 kW of RF power.

Figure 18:
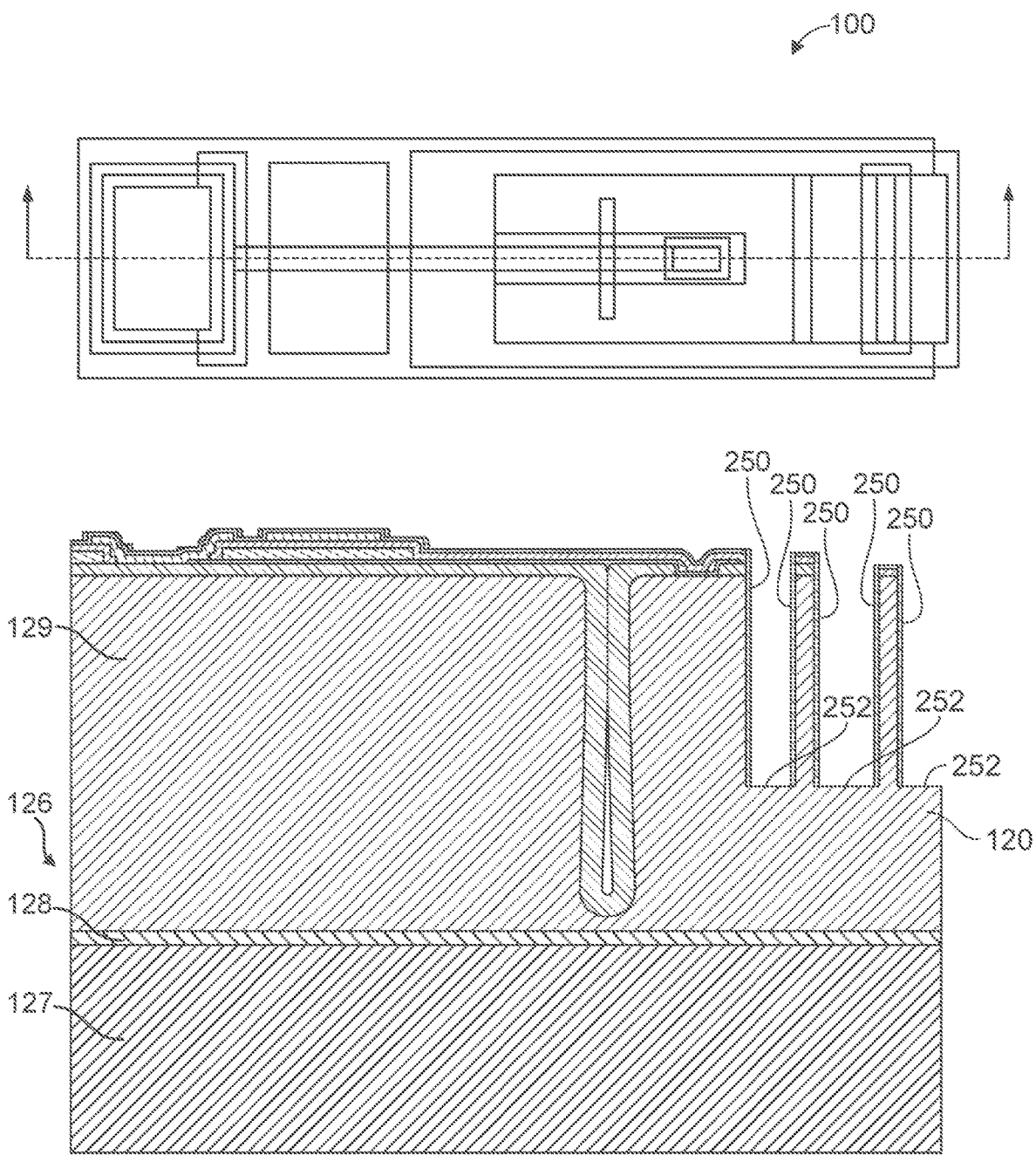

As shown in FIG. 18 (Step P), portions of second dielectric layer 250 formed on trench floors 252 can be removed. For example, second dielectric layer 250 can be an oxide and trench floors 252 can be removed with an anisotropic dry oxide etch, exposing surfaces of top layer 129. In an embodiment, any residue formed on sidewalls 251 by dry etching can be removed. By removing the residue on sidewalls 251, portions of second dielectric layer 250 remaining on sidewalls 251 can be more easily removed in a subsequent etching step, since such residues can inhibit subsequent etching.

Figure 19:
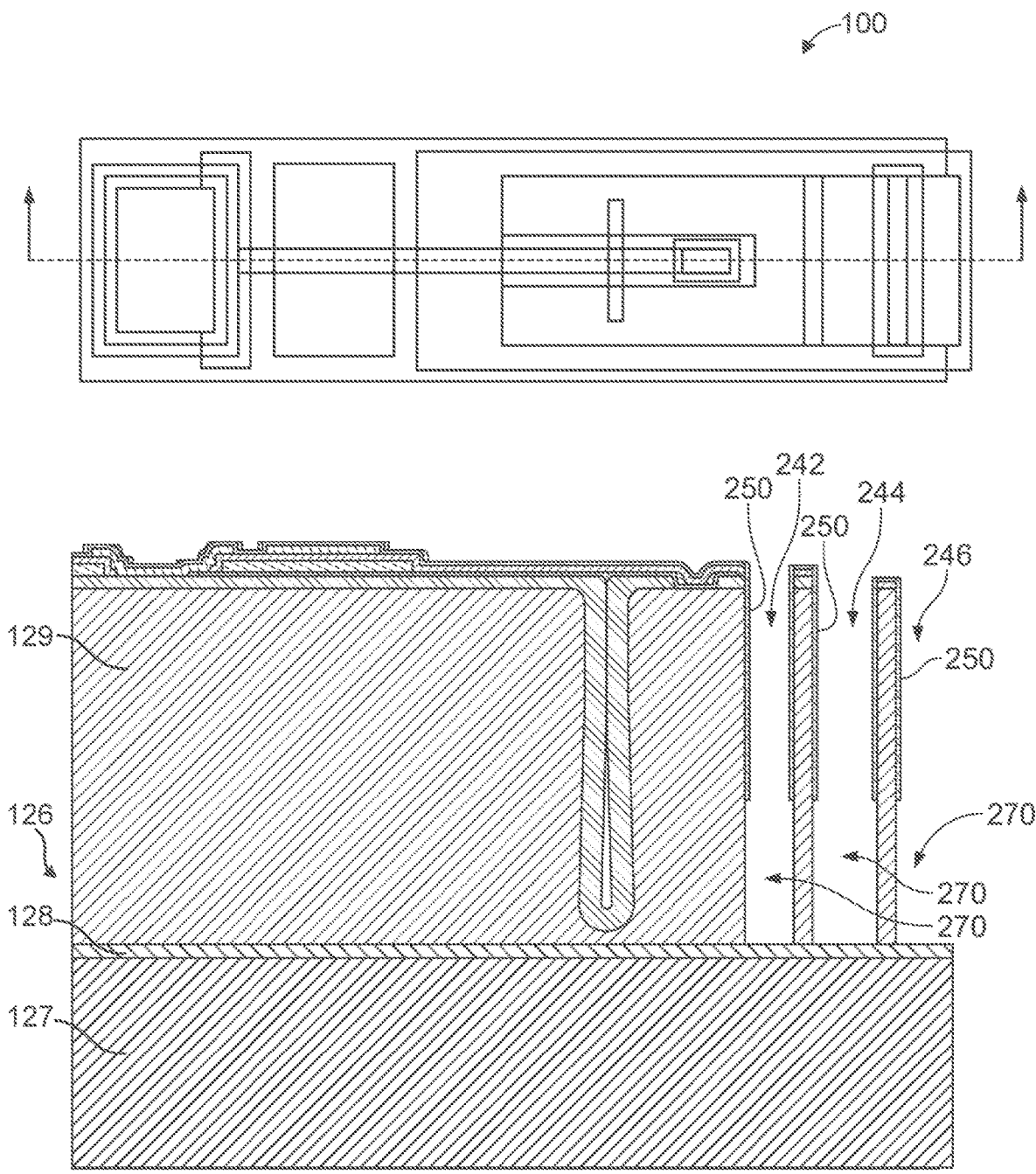

Next, as shown in FIG. 19 (Step Q), the depth of trenches 242, 244, and 246 can be extended by further etching top layer 129 of SOI substrate 126. In an example, top layer 129 can be silicon and etched using an anisotropic silicon extension etch. The depth of trenches 242, 244, and 246 can extend to buried insulator layer 128, which can act as an etch stop, for example, an anisotropic silicon etch stop. In an example, top layer 129 can be silicon and buried insulator layer 128 can be silicon dioxide or silicon nitride, and top layer 129 can be etched down to buried insulator layer 128 by anisotropic wet silicon etching (e.g., potassium hydroxide (KOH), ethylene diamine pyrocatechol (EDP), tetramethylammonium hydroxide (TMAH), etc.) or anisotropic dry silicon etching (e.g. plasma etching, reactive ion etching (RIE), deep reactive ion etching (DRIE), $CCl_4$ etching, $Cl_2$ etching, $CCl_2F_2$ etching, etc.). The resulting exposed regions 270 of trenches 242, 244, and 246 can have sidewalls without second dielectric layer 250. In one example, the depth of exposed regions 270 can be about 2 μm to about 15 μm. The depth, however, can vary depending on the desired height of the beams 106, 107, and 108. The depth of exposed regions 270 can help define the distance between the resulting silicon beams 106, 107, and 108 and the floor of SOI substrate 126, which is defined by buried insulator layer 128. In an example, exposed regions 270 extend in depth to buried insulator layer 128. In one embodiment, the residue formed from the extension etch, for example, silicon etch, is not removed so that SOI substrate 126 can be directly transitioned to a release etch, as described below, without venting the etch chamber, which can reduce the amount of native oxides that can form on the substrate surface, and reduce any disruption to the initiation and reproducibility of the release etch. Alternatively, the residue can be removed.

Next, at least one beam can be formed. For example, beams 106, 107, and 108 can be formed by a release etch. FIG. 20 (Step R) shows MEMS device 100 after a release etch, for example, a dry isotropic silicon release etch, such as a plasma etch using $SF_6$. The release etch can create a cavity 280 that separates beams 106, 107, and 108 from a floor 282 of buried insulator layer 128 of SOI substrate 126, thereby allowing beams 106, 107, and 108 to flex or move during operation of MEMS device 100. The depth of the release etch is defined (e.g., limited) by buried insulator layer 128 which can act as an etch stop. In an embodiment, after the release etch, beams 106 and 107 can have first dielectric layer 123 and second dielectric passivation layer 190 on top, while beam 108 can have only second dielectric passivation layer 190 on top due to the opening 180 formed in first dielectric layer 123 during a prior processing step.

Figure 21:
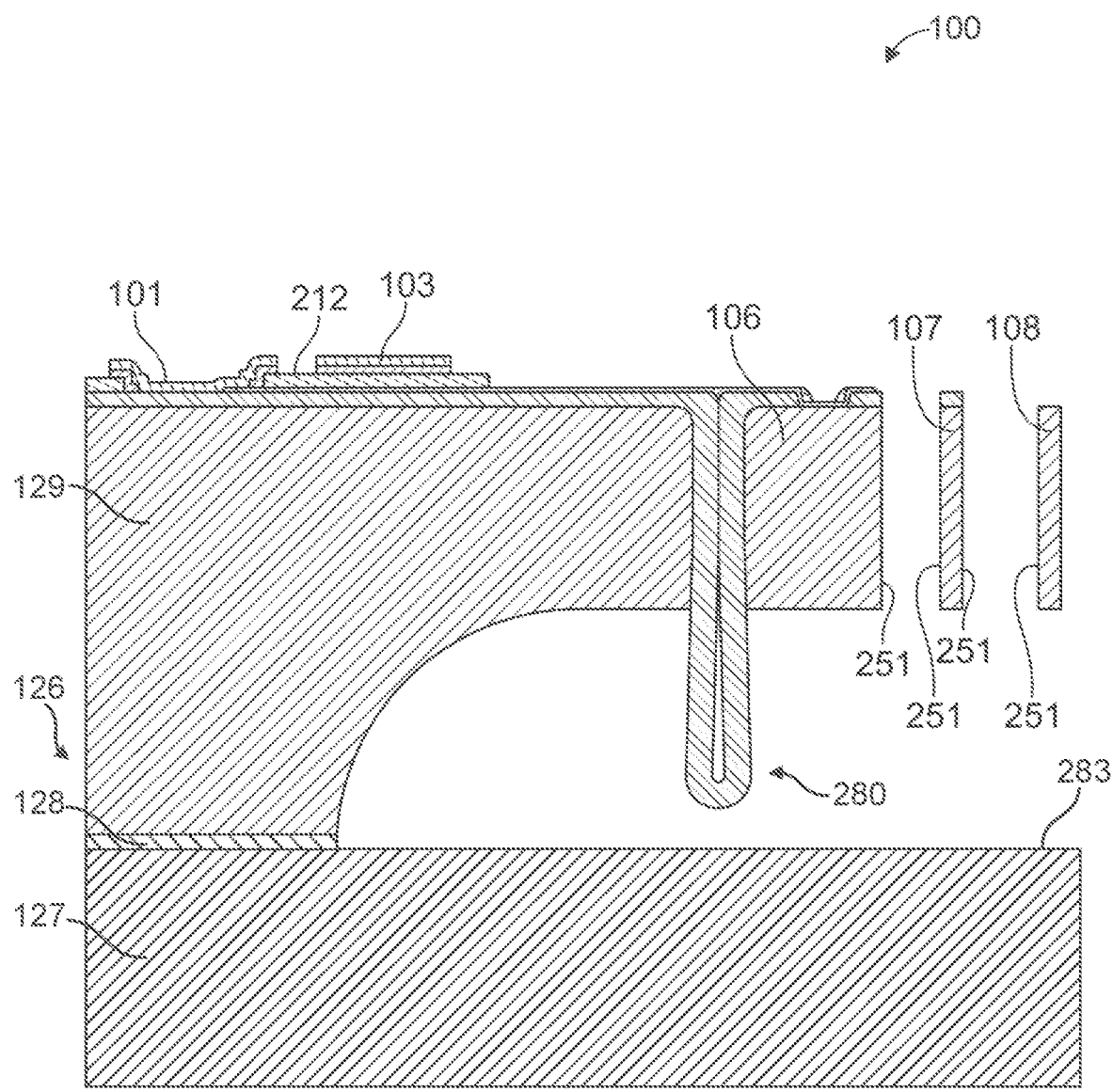

In one embodiment, portions of second dielectric layer 250 formed on sidewalls 251 of beams 106, 107, and 108 can be removed along with buried insulator layer 128 by an etch step, as shown in FIG. 21 (Step S). For example, these portions of second dielectric layer 250 can be removed using a hydrogen fluoride (HF) vapor etching system, such as a PRIMAXX system, for approximately 4 minutes. Buried insulator layer 128 can be removed during the etch step to form a floor 283 of bottom layer 127 of SOI substrate 126, thereby further allowing beams 106, 107, and 108 to flex or move during operation of MEMS device 100. Removing these portions of second dielectric layer 250 on sidewalls 251 of beams 106, 107, and 108 and buried insulator layer 128 can be advantageous. As discussed above, if there is a dielectric layer on sidewalls 251 or floor 283 (e.g., lower bump stop) of SOI substrate 126, electrical charges can develop in the sidewall coatings or floor coating when the beams contact each other or the floor during operation of MEMS device 100. By removing second dielectric layer 250, the outer surface of sidewalls 251 can comprise a semiconductor, e.g., silicon, and not a dielectric material. Similarly, by removing buried insulator layer 128 in cavity 280, floor 283 of bottom layer 127, which can act as a lower bump stop, can comprise a semiconductor, e.g., silicon, and not a dielectric material. Accordingly, any electrical charges created from beam contact can dissipate quickly, which can help prevent an unwanted force from being applied to the beams. In an embodiment, the HF vapor etch can be controlled so that etching of isolation joint 105 can be reduced. If the HF vapor etch is uncontrolled, isolation joint 105 can be weakened since it can comprise silicon dioxide like second dielectric layer 250 and, for example, buried insulator layer 128. However, isolation joint 105 can be made from thermal oxide, and isolation joint 105 can etch at a slower rate than second dielectric layer 250 and/or buried insulator layer 128.

In another embodiment, second dielectric layer 250 and second dielectric passivation layer 190 can be removed from top layer 129 during the etch step, for example, an HF vapor etch, exposing metal bond pad 101 and gap 212 around metal seal ring surface 103. This removal can allow for wire bonding with metal bond pad 101 and a lid to seal with metal seal ring surface 103. In another embodiment, second dielectric passivation layer 190 on top of beams 107 and 108 can be removed during the etch step, for example, an HF vapor etch.

In one embodiment, the thickness of second dielectric layer 250, second dielectric passivation layer 190, and/or buried insulator layer 128 can be minimized to reduce the etching of the isolation joint 105 during the HF vapor etch. For example, the thickness of second dielectric layer 250, second dielectric passivation layer 190, and/or buried insulator layer 128 can be less than about 450 nm, and preferably less than about 400 nm. Any thickness below about 450 nm can minimize the etching effect on isolation joint 105. In another embodiment, an anti-stiction coating can be applied to help prevent beams 106, 107, and 108 from sticking during operation of MEMS device 100.

Figure 22:
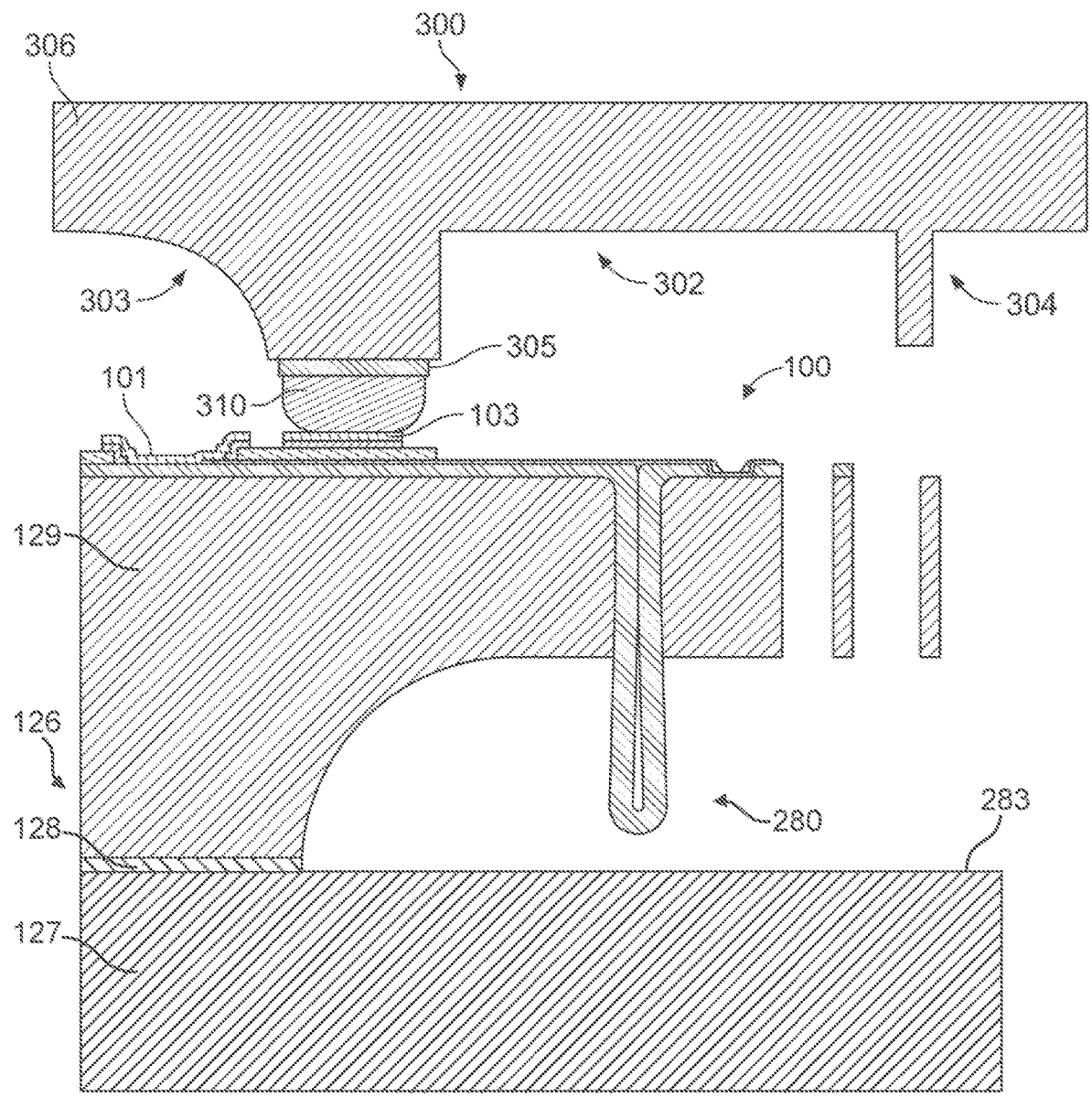

As shown in FIG. 22 (Step T), a lid 300 can be coupled to MEMS device 100 at metal seal ring surface 103. Lid 300 can form a hermetic seal with SOI substrate 126. Lid 300 can include a metal seal region 305. In an embodiment, metal seal region 305 can be, for example, aluminum deposited at about 700 nm. Metal seal region 305 can be patterned and etched using any suitable lithographic technique, for example, photolithography, and metal etching. Lid 300 can also have a bump stop 304 that can prevent overflexing of one or more beams, for example, beam 108. Bump stop 304 can be formed by using any suitable lithographic technique, for example, photolithography, and silicon etching, for example, an anisotropic dry silicon etching, to define a first recess 302. Lid 300 can also have a second recess 303 along an outer edge defining a channel 306. Second recess 303 can be formed using a wafer dicing saw to facilitate the removal of the channel silicon. A glass frit 310 can be formed on lid 300 by, for example, using a screen printer and a furnace heated up to about 420° C.

Figure 23:
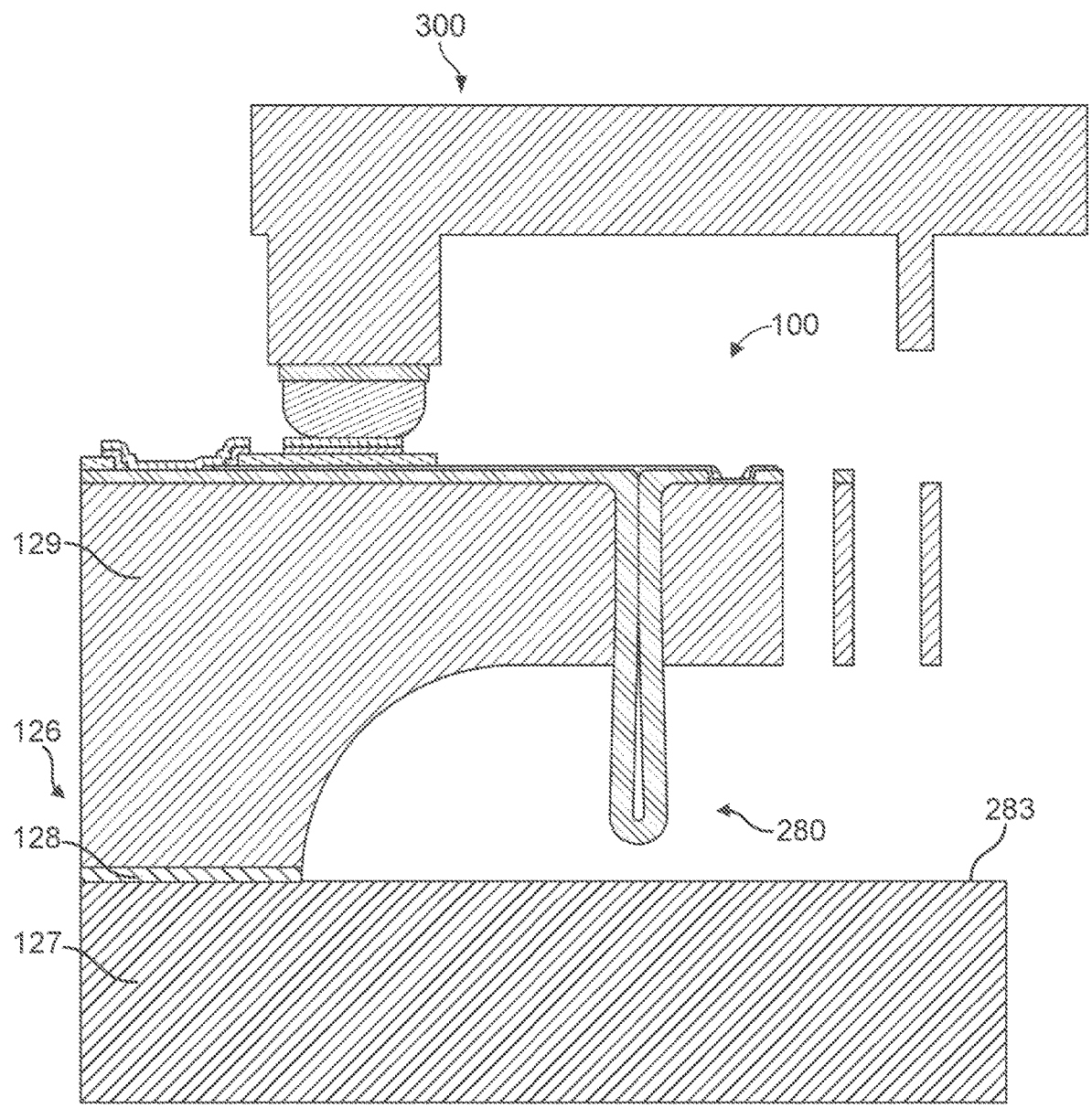

Lid 300 can be bonded with SOI substrate 126 by, for example, using a standard wafer bonder, such as an EVG 501 bonder. After bonding, as shown in FIG. 23 (Step U), channel 306 of lid 300 can be removed to expose metal bond pad 101. Channel 306 can be removed by any suitable means, for example, a wafer dicing saw. The wafer dicing saw can be aligned using a preexisting pattern on the top of lid 300, or using an infrared (IR) dicing saw that can identify and orient to alignment marks through lid 300 on the lower side of SOI substrate 126.

In another embodiment, MEMS device 100 can have a beam with an integrated isolation joint and a metal trace, for example, beam 106; a beam having a dielectric coating on top, for example, beam 107; a beam comprising only silicon, for example, beam 108; or any combination thereof. Beams having an isolation joint and a metal trace can be useful in complex MEMS devices requiring multiple electrical potentials, such as gyroscopes. Beams having a dielectric coating on top can be useful for devices that need bowed beams, for example, for enabling out-of-plane capacitive sensors. Beams comprising only silicon can be useful for inertial sensors having surfaces that can impact and potentially charge if made or coated with a dielectric material.

In some embodiments, conductive vias can be formed to make electrical connections to top layer 129 and bottom layer 127 separated by buried insulator layer 128. For example, polysilicon vias can be fabricated between bottom layer 127, buried insulator layer 128, and/or top layer 129, for example, either pre- or post-MEMS device fabrication.

Exemplary Software Implementations

In addition to hardware implementations of MEMS devices described above, such MEMS devices can also be embodied in software disposed, for example, in a computer usable (e.g., readable) medium configured to store the software (e.g., a computer readable program code). The program code can cause the enablement of embodiments of the present disclosure, including the fabrication of MEMS devices disclosed herein.

For example, this can be accomplished through the use of general programming languages (such as C, C++, C#, Python, Perl, Java, etc.), hardware description languages (HDL) including Verilog HDL, VHDL, Altera HDL (AHDL) and so on, or other available programming and/or schematic capture tools (such as circuit capture tools). The program code can be disposed in any known computer usable medium including semiconductor, magnetic disk, optical disk (such as CD-ROM, DVD-ROM), and as a computer data signal embodied in a computer usable (e.g., readable) transmission medium (such as a carrier wave or any other medium including digital, optical, or analog-based medium). As such, the code can be transmitted over communication networks including the Internet and/or intranets. It is understood that the functions accomplished and/or structure provided by the systems and techniques described above can be embodied in program code and may be transformed to hardware as part of the production of MEMS devices.

Exemplary MEMS Devices On Double SOI Substrates

As mentioned above, the present disclosure is directed to reducing damage to isolation joints which can break or fracture, for example, during high-g shock conditions. By utilizing SOI substrates, a length or depth of an isolation joint can be controlled for a desired length or depth. Further, by utilizing double SOI substrates, which include two separate buried insulator layers, a shallow isolation joint and a shallow cavity can be formed. For example, a controlled depth of an isolation trench for an isolation joint can be formed because a top (first) buried insulator layer of the double SOI substrate can act as a first etch stop, and a controlled spacing between movable structures and non-movable structures can be formed because a lower (second) buried insulator layer can act as a second etch stop.

FIGS. 24 through 30, which illustrate schematic cross-sectional views of MEMS device 100' along line 3-3 as shown in FIG. 1, disclose alternative embodiments of making MEMS device 100. In some embodiments, FIGS. 24 through 30 correspond to fabrication processing Steps A, B, N, P, Q, R, and S, respectively. The embodiments of MEMS device 100 shown in FIGS. 3-23 and the embodiments of MEMS device 100' shown in FIGS. 24-30 are similar. Similar reference numbers are used to indicate similar features of the embodiments of MEMS device 100 shown in FIGS. 3-23 and the similar features of the embodiments of MEMS device 100' shown in FIGS. 24-30. The main differences between the embodiments of MEMS device 100 shown in FIGS. 3-23 and the embodiments of MEMS device 100' shown in FIGS. 24-30 are that MEMS device 100' includes double SOI substrate 126' with first buried insulator layer 128a, intermediate layer 128b, and second buried insulator layer 128c, rather than SOI substrate 126, and isolation joint 105 forms a shallow depth or length in cavity 280 due to second (top) buried insulator layer 128c acting as an etch stop for isolation trench 121.

Figure 24:
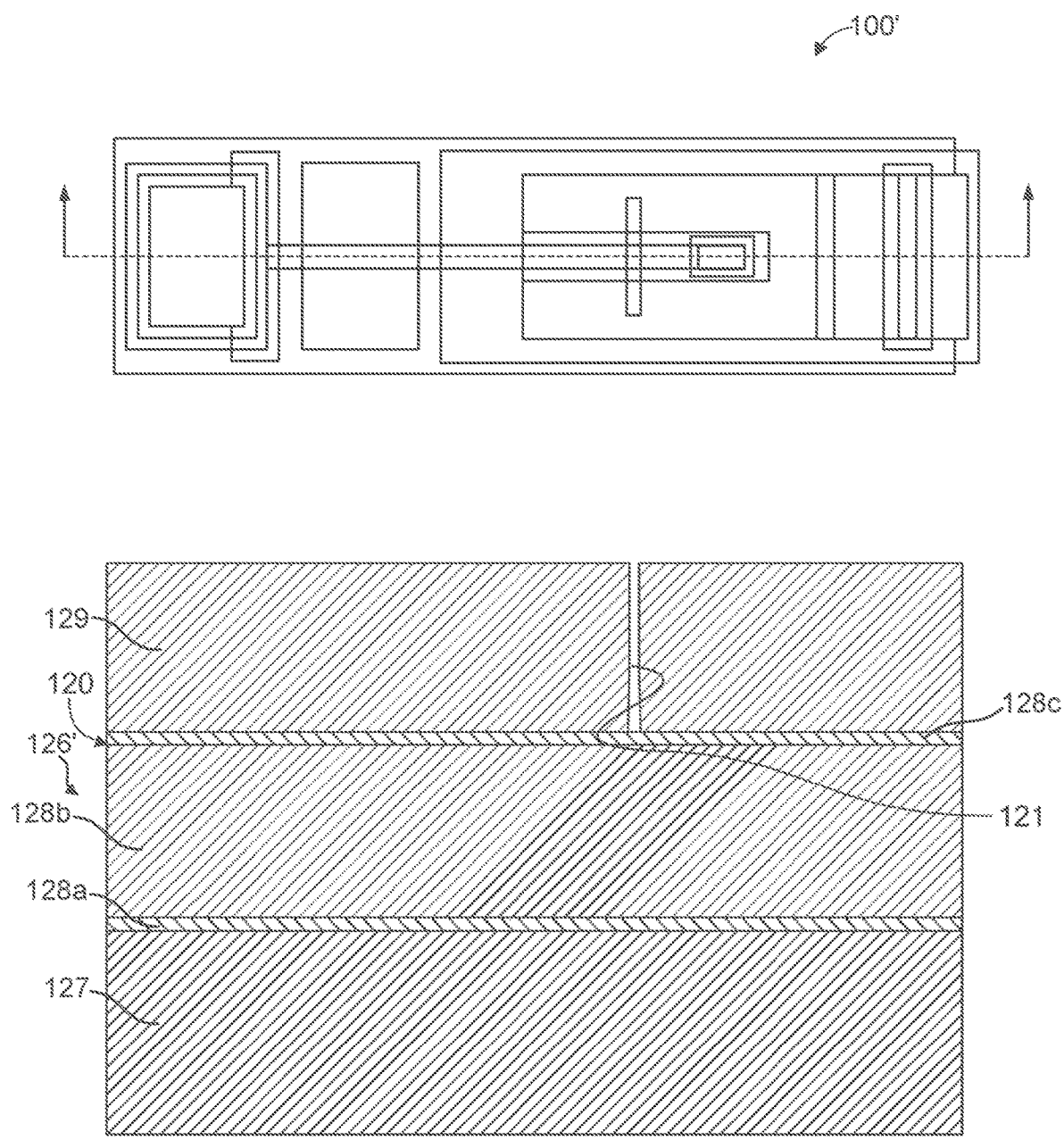
FIGS. 24-30 are schematic top view and cross-sectional view illustrations of an exemplary method of making a MEMS device on a double SOI substrate, according to exemplary embodiments.
Figure 29:
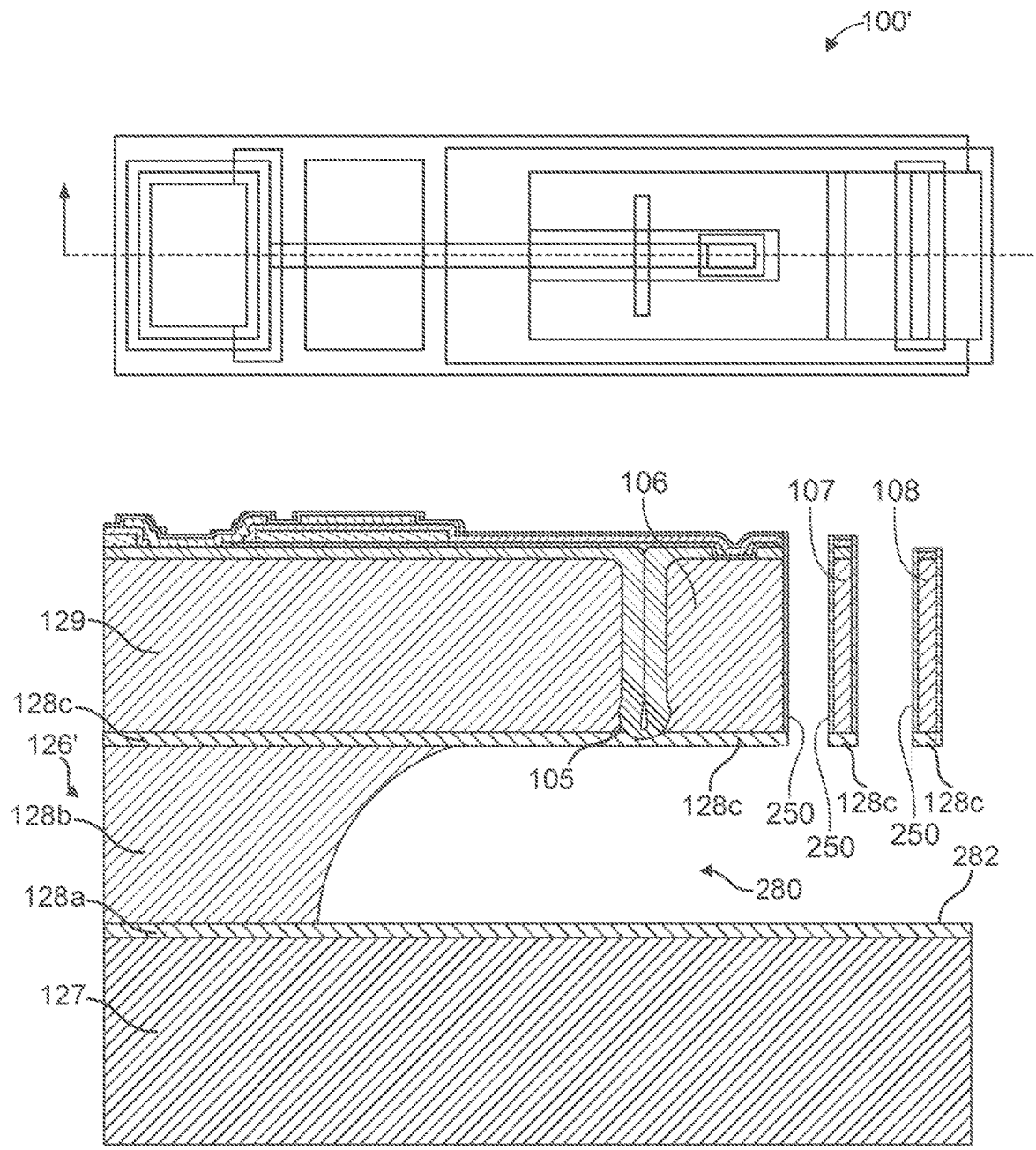

In FIG. 24 (Step A), isolation trench 121 can be formed in double SOI substrate 126'. Double SOI substrate 126' can include a first buried insulator layer 128a, for example, silicon dioxide, disposed between an intermediate layer 128b and a bulk (bottom) layer 127, and a second buried insulator layer 128c, for example, silicon dioxide, disposed between an active (top) layer 129 and intermediate layer 128b. For example, double SOI substrate 126' can undergo double ion implantation (e.g., oxygen ions), deep (first) implant and shallow (second) implant, and can be thermally oxidized or annealed to form first buried insulator layer 128a and second buried insulator layer 128c (e.g., separation by implantation of oxygen (SIMOX) process), for example, each having a thickness of about 50 nm to about 500 nm; however, any other suitable method can be used such as chemical vapor deposition (CVD), wafer bonding, seed methods, SMART CUT™ (Soitec), NANOCLEAVE® (Silicon Genesis), or ELTRAN® (Canon). In some embodiments, second buried insulator layer 128c can be configured to define a depth of isolation joint 105 of double SOI substrate 126' in cavity 280. For example, as shown in FIG. 24, second buried insulator layer 128c can define or limit a depth of isolation trench 121 (e.g., act as an etch stop) that defines or limits a depth of isolation joint 105 in cavity 280, for example, as shown in FIG. 29. In some embodiments, first buried insulator layer 128a and second buried insulator layer 128c can define cavity 280. For example, as shown in FIG. 29, first buried insulator layer 128a can define a bottom portion of cavity 280, for example, floor 282 and second buried insulator layer 128c can define a top portion of cavity 280.

In an embodiment, isolation trench 121 can be formed in top layer 129 of double SOI substrate 126'. An isolation trench pattern can be transferred to double SOI substrate 126' to form isolation trench 121 where isolation joint 105 will be formed. Isolation trench 121 can have any suitable profile, for example, a reentrant profile in which the top is narrower than the bottom, such as illustrated in FIG. 24. An embodiment includes a profile that monotonically increases in width. As shown in FIG. 24, isolation trench 121 can be disposed above second buried insulator layer 128c. In some embodiments, isolation trench 121 can extend to second buried insulator layer 128c, which can act as a first etch stop. In an example, top layer 129 can be silicon and etched using an anisotropic silicon extension etch. The depth of isolation trench 121 can extend to second buried insulator layer 128c, which can act as an etch stop, for example, an anisotropic silicon etch stop.

Figure 25:
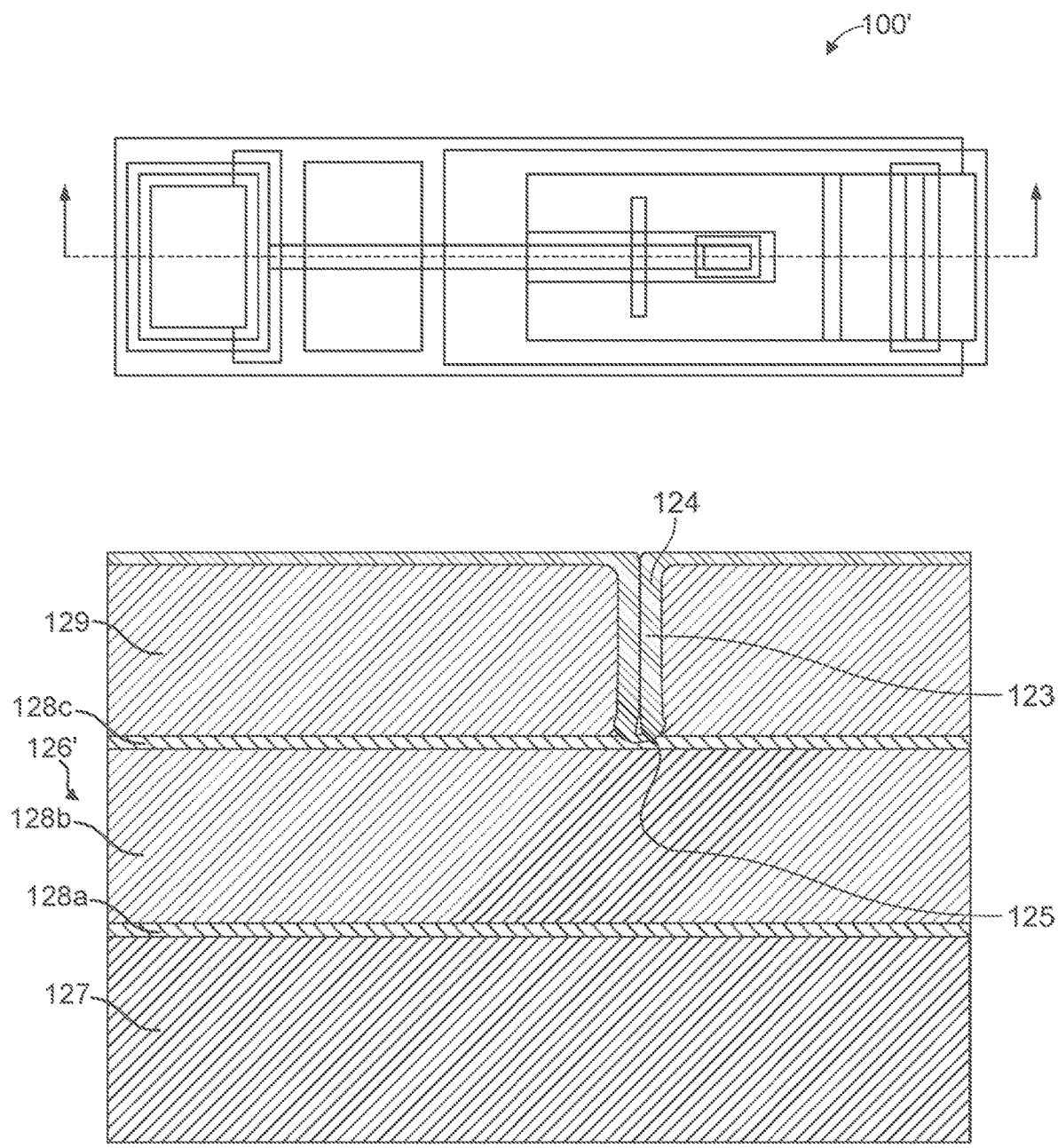

As illustrated in FIG. 25 (Step B), isolation trench 121 can be filled with a first dielectric layer 123, for example, silicon dioxide or any other suitable dielectric material. In an embodiment, double SOI substrate 126' can include silicon and top layer 129 can be thermally oxidized to form a layer of silicon dioxide. Top layer 129 can be oxidized at about 1100° C. to about 1200° C. with wet oxidation to form silicon dioxide having a thickness of about 1.5 μm to about 2.5 μm. An opening 124 of isolation trench 121 can be sealed, and a void 125 can remain after the oxidization process. In some embodiments, as shown in FIG. 25, during filling isolation trench 121 with first dielectric layer 123, first dielectric layer 123 can extend to second buried insulator layer 128c and/or intermediate layer 128b. For example, both second buried insulator layer 128c and intermediate layer 128b can form silicon dioxide from thermal oxidation or annealing.

In the interest of brevity, Steps C through M and Step O will not be described.

Figure 26:
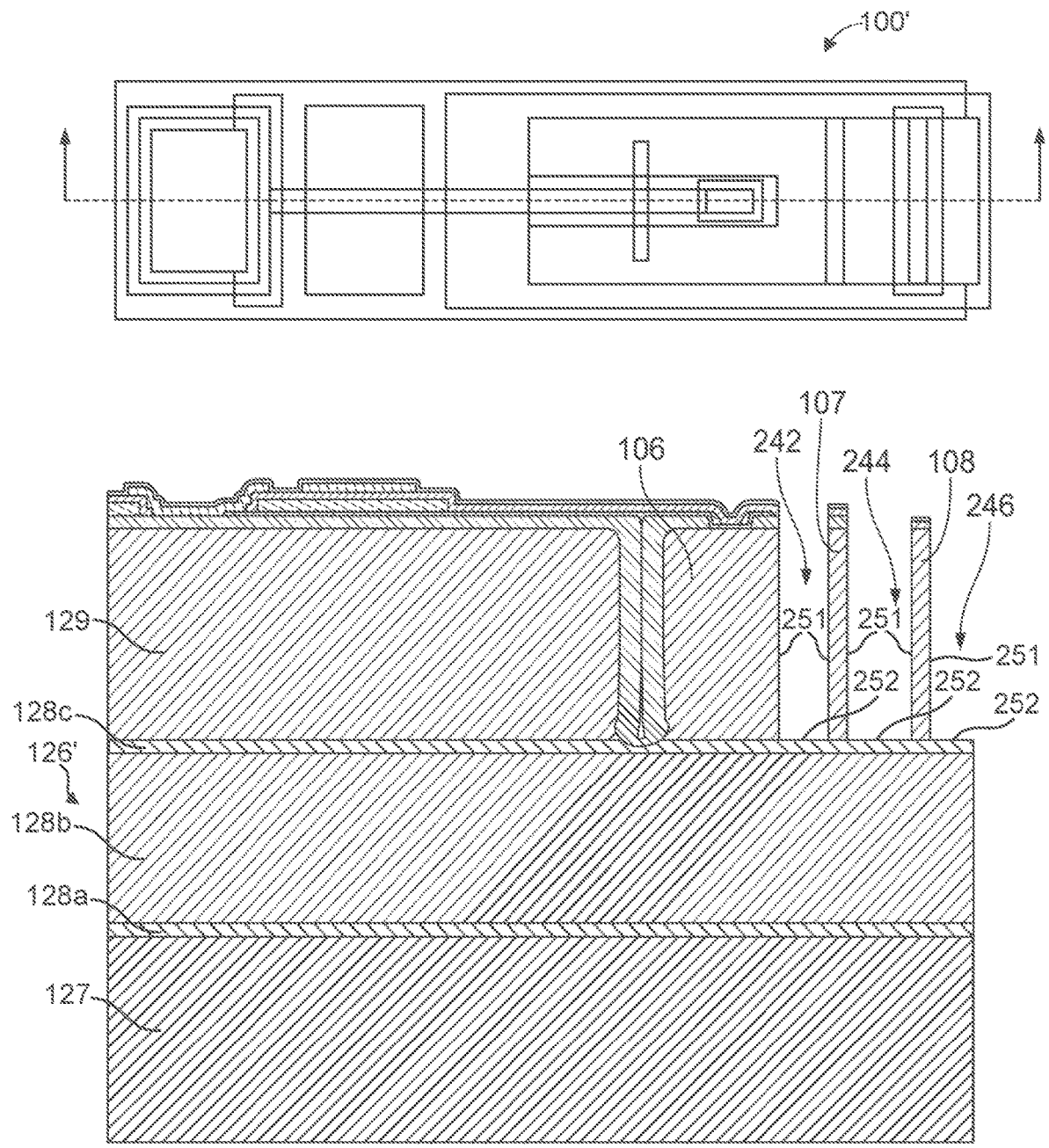

As shown in FIG. 26 (Step N), top layer 129 of double SOI substrate 126' can be patterned and etched to create at least one trench that can define a profile of a beam. For example, trenches 242, 244, and 246 can be formed in top layer 129 to define the profiles of beams 106, 107, and 108. In one embodiment, trenches 242, 244, and 246 can be formed by using any suitable lithographic technique, for example, photolithography, and a series of dry etching steps that etch third dielectric passivation layer 230, second dielectric passivation layer 190, first dielectric layer 123, and top layer 129. In one example, a standard plasma dry etch using $CHF_3$ and $O_2$ can be used to etch third dielectric passivation layer 230, second dielectric passivation layer 190, and first dielectric layer 123. In an embodiment, top layer 129 can be etched using a silicon etch chamber running the Bosch process. In another embodiment, metal trace 104 can be etched if metal trace 104 is within the masking stack. In another embodiment, any residue remaining from etching third dielectric passivation layer 230, second dielectric passivation layer 190, first dielectric layer 123, and top layer 129 can be removed.

The depth of trenches 242, 244, and 246 in top layer 129 can extend to second buried insulator layer 128c, which can act as an etch stop, for example, an anisotropic silicon etch stop. In an example, top layer 129 can be silicon and second buried insulator layer 128c can be silicon dioxide or silicon nitride, and top layer 129 can be etched down to second buried insulator layer 128c by anisotropic wet silicon etching (e.g., potassium hydroxide (KOH), ethylene diamine pyrocatechol (EDP), tetramethylammonium hydroxide (TMAH), etc.) or anisotropic dry silicon etching (e.g. plasma etching, reactive ion etching (RIE), deep reactive ion etching (DRIE), $CCl_4$ etching, $Cl_2$ etching, $CCl_2F_2$ etching, etc.). In one example, the depth of trenches 242, 244, and 246 can be about 1 μm to about 30 μm. The depth, however, can vary depending on the desired height of the beams 106, 107, and 108.

Figure 27:
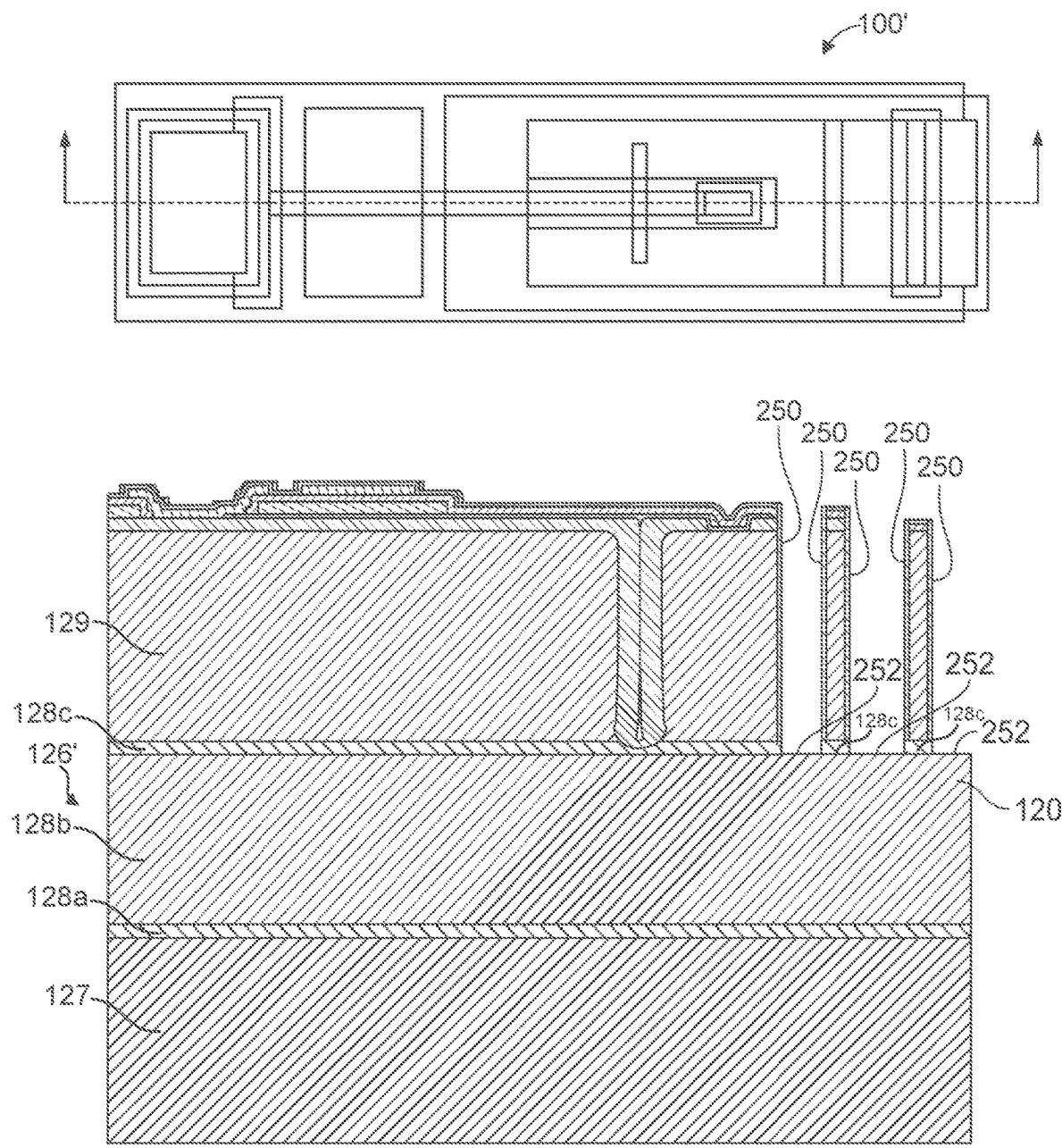

As shown in FIG. 27 (Step P), portions of second dielectric layer 250 formed on trench floors 252 and second buried insulator layer 128c can be removed in an etch step. For example, second dielectric layer 250 and second buried insulator layer 128c can be an oxide and trench floors 252 can be removed with an anisotropic dry oxide etch, exposing surfaces of intermediate layer 128b. In an embodiment, any residue formed on sidewalls 251 by dry etching can be removed. By removing the residue on sidewalls 251, portions of second dielectric layer 250 remaining on sidewalls 251 can be more easily removed in a subsequent etching step, since such residues can inhibit subsequent etching.

Figure 28:
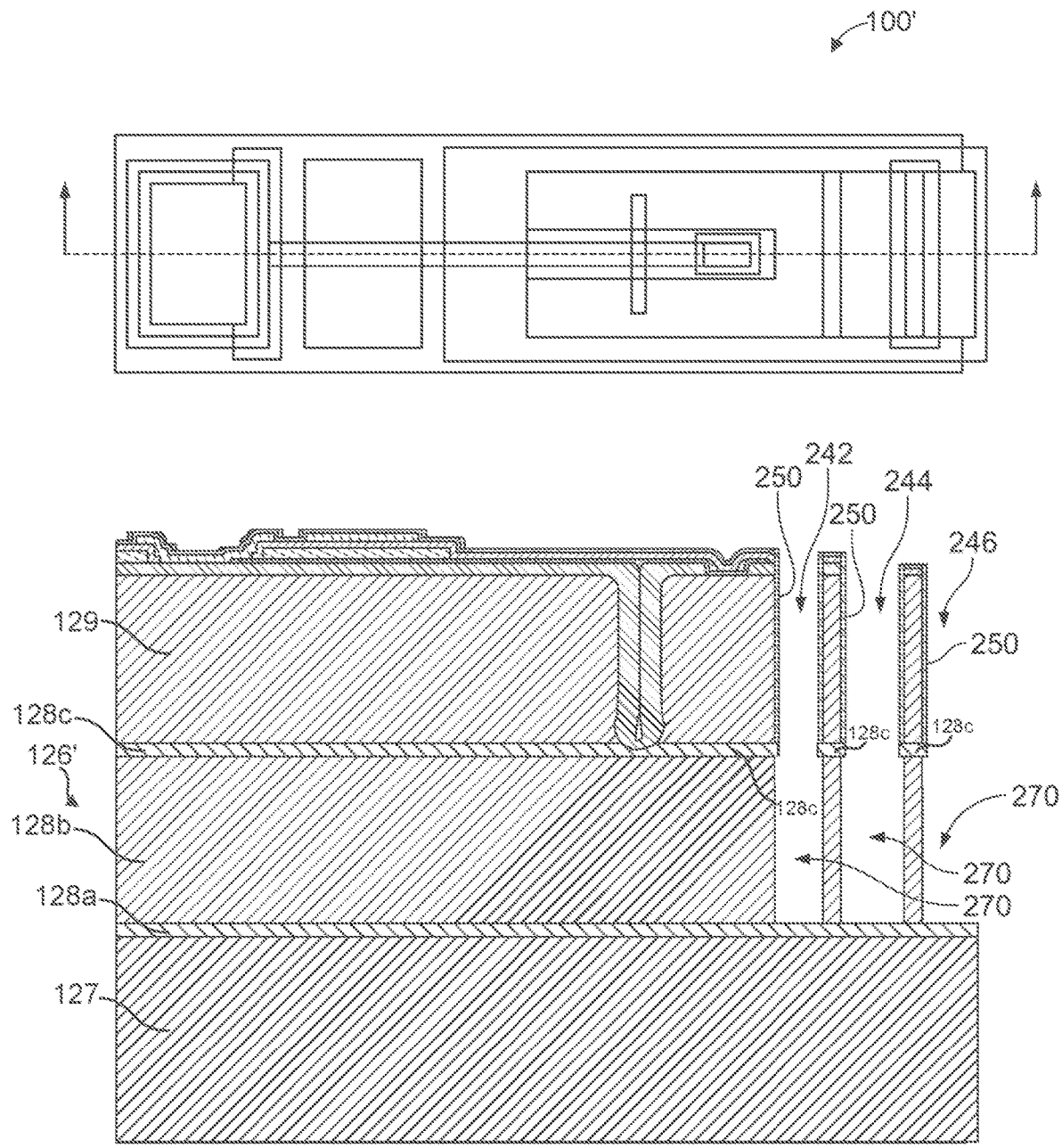

Next, as shown in FIG. 28 (Step Q), the depth of trenches 242, 244, and 246 can be extended by etching intermediate layer 128b of double SOI substrate 126'. In an example, intermediate layer 128b can be silicon and etched using an anisotropic silicon extension etch. The depth of trenches 242, 244, and 246 can extend to first buried insulator layer 128a, which can act as an etch stop, for example, an anisotropic silicon etch stop. In an example, intermediate layer 128b can be silicon and first buried insulator layer 128a can be silicon dioxide or silicon nitride, and intermediate layer 128b can be etched down to first buried insulator layer 128a by anisotropic wet silicon etching (e.g., potassium hydroxide (KOH), ethylene diamine pyrocatechol (EDP), tetramethylammonium hydroxide (TMAH), etc.) or anisotropic dry silicon etching (e.g. plasma etching, reactive ion etching (RIE), deep reactive ion etching (DRIE), $CCl_4$ etching, $Cl_2$ etching, $CCl_2F_2$ etching, etc.). The resulting exposed regions 270 of trenches 242, 244, and 246 can have sidewalls without second dielectric layer 250. In one example, the depth of exposed regions 270 can be about 1 μm to about 30 μm. The depth, however, can vary depending on the desired height of the beams 106, 107, and 108. The depth of exposed regions 270 and/or depth position of first buried insulator layer 128a can help define the distance between the resulting silicon beams 106, 107, and 108 and the floor of double SOI substrate 126', which is defined by first buried insulator layer 128a. In an example, exposed regions 270 extend in depth to first buried insulator layer 128a. In some embodiments, the depth position of first buried insulator 128a can be about 1 μm to about 50 μm. In one embodiment, the residue formed from the extension etch, for example, silicon etch, is not removed so that double SOI substrate 126' can be directly transitioned to a release etch, as described below, without venting the etch chamber, which can reduce the amount of native oxides that can form on the substrate surface, and reduce any disruption to the initiation and reproducibility of the release etch. Alternatively, the residue can be removed.

Next, at least one beam can be formed. For example, beams 106, 107, and 108 can be formed by a release etch. FIG. 29 (Step R) shows MEMS device 100' after a release etch, for example, a dry isotropic silicon release etch, such as a plasma etch using $SF_6$. The release etch can create a cavity 280 that separates beams 106, 107, and 108 from a floor 282 of first buried insulator layer 128a of double SOI substrate 126', thereby allowing beams 106, 107, and 108 to flex or move during operation of MEMS device 100'. The depth of the release etch is defined (e.g., limited) by first buried insulator layer 128a which can act as an etch stop. In an embodiment, after the release etch, beams 106 and 107 can have first dielectric layer 123 and second dielectric passivation layer 190 on top, while beam 108 can have only second dielectric passivation layer 190 on top due to the opening 180 formed in first dielectric layer 123 during a prior processing step.

Figure 30:
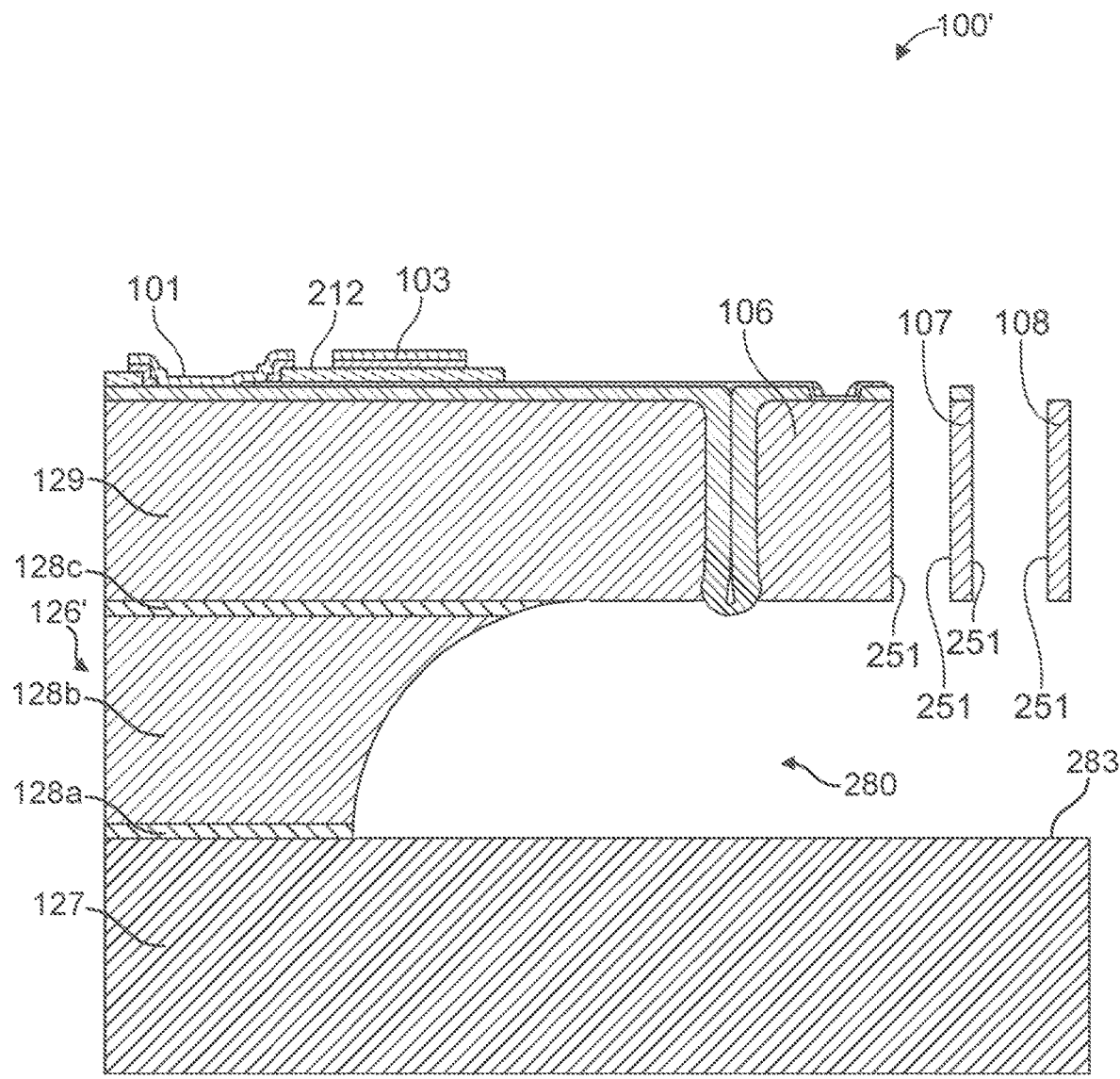

In one embodiment, portions of second dielectric layer 250 formed on sidewalls 251 of beams 106, 107, and 108 can be removed along with first buried insulator layer 128a and second buried insulator layer 128c in cavity 280 by an etch step, as shown in FIG. 30 (Step S). For example, these portions of second dielectric layer 250 can be removed using a hydrogen fluoride (HF) vapor etching system, such as a PRIMAXX system, for approximately 4 minutes. Second buried insulator layer 128c can be removed during the etch step to remove any dielectric (e.g., oxide, nitride) from a bottom surface of beams 106, 107, and 108. First buried insulator layer 128a can be removed during the etch step to form a floor 283 of bottom layer 127 of double SOI substrate 126', thereby further allowing beams 106, 107, and 108 to flex or move during operation of MEMS device 100'. Removing these portions of second dielectric layer 250 on sidewalls 251 of beams 106, 107, and 108, second buried insulator layer 128c on bottoms of beams 106, 107, and 108 and an exposed bottom of top layer 129, and first buried insulator layer 128a can be advantageous. As discussed above, if there is a dielectric layer on sidewalls 251, a bottom of beams 106, 107, and 108, or floor 283 (e.g., lower bump stop) of double SOI substrate 126', electrical charges can develop in the sidewall coatings, bottom coatings, or floor coating when the beams contact each other or the floor during operation of MEMS device 100'. By removing second dielectric layer 250, the outer surface of sidewalls 251 can comprise a semiconductor, e.g., silicon, and not a dielectric material. Similarly, by removing second buried insulator layer 128c in cavity 280, the bottom surface of beams 106, 107, and 108 can comprise a semiconductor, e.g., silicon, and not a dielectric material. Similarly, by removing first buried insulator layer 128a in cavity 280, floor 283 of bottom layer 127, which can act as a lower bump stop, can comprise a semiconductor, e.g., silicon, and not a dielectric material. Accordingly, any electrical charges created from beam contact can dissipate quickly, which can help prevent an unwanted force from being applied to the beams. In an embodiment, the HF vapor etch can be controlled so that etching of isolation joint 105 can be reduced. If the HF vapor etch is uncontrolled, isolation joint 105 can be weakened since it can comprise silicon dioxide like second dielectric layer 250 and, for example, first buried insulator layer 128a and/or second buried insulator layer 128c. However, isolation joint 105 can be made from thermal oxide, and isolation joint 105 can etch at a slower rate than second dielectric layer 250, first buried insulator layer 128a, and/or second buried insulator layer 128c.

In another embodiment, second dielectric layer 250 and second dielectric passivation layer 190 can be removed from top layer 129 during the etch step, for example, an HF vapor etch, exposing metal bond pad 101 and gap 212 around metal seal ring surface 103. This removal can allow for wire bonding with metal bond pad 101 and a lid to seal with metal seal ring surface 103. In another embodiment, second dielectric passivation layer 190 on top of beams 107 and 108 can be removed during the etch step, for example, an HF vapor etch.

In one embodiment, the thickness of second dielectric layer 250, second dielectric passivation layer 190, first buried insulator layer 128a, and/or second buried insulator layer 128c can be minimized to reduce the etching of the isolation joint 105 during the HF vapor etch. For example, the thickness of second dielectric layer 250, second dielectric passivation layer 190, first buried insulator layer 128a, and/or second buried insulator layer 128c can be less than about 450 nm, and preferably less than about 400 nm. Any thickness below about 450 nm can minimize the etching effect on isolation joint 105. In another embodiment, an anti-stiction coating can be applied to help prevent beams 106, 107, and 108 from sticking during operation of MEMS device 100'.

In the interest of brevity, Steps T and U will not be described.

Exemplary MEMS Devices On Cavity SOI Substrates

As mentioned above, the present disclosure is directed to reducing the number of fabrication processing steps to fabricate a MEMS device. By utilizing cavity SOI substrates, which include a pre-etched buried cavity, a shallow isolation joint and a shallow cavity can be formed while omitting several processing steps, saving cost and time and increasing throughput. For example, a controlled depth of an isolation trench for an isolation joint can be formed because a buried insulator layer of the cavity SOI substrate can act as an etch stop, and a controlled spacing between movable structures and non-movable structures can be accessed because of the pre-etched buried cavity.

FIGS. 31 through 35, which illustrate schematic cross-sectional views of MEMS device 100" along line 3-3 as shown in FIG. 1, disclose alternative embodiments of making MEMS device 100. In some embodiments, FIGS. 31 through 35 correspond to fabrication processing Steps A, B, N, Q, and S, respectively. The embodiments of MEMS device 100 shown in FIGS. 3-23 and the embodiments of MEMS device 100" shown in FIGS. 31-35 are similar. Similar reference numbers are used to indicate similar features of the embodiments of MEMS device 100 shown in FIGS. 3-23 and the similar features of the embodiments of MEMS device 100" shown in FIGS. 31-35. The main differences between the embodiments of MEMS device 100 shown in FIGS. 3-23 and the embodiments of MEMS device 100" shown in FIGS. 31-35 are that MEMS device 100" includes cavity SOI substrate 126" with pre-etched cavity 281 and floor 284 (e.g., lower bump stop) disposed in bottom layer 127 below buried insulator layer 128, rather than SOI substrate 126, and isolation joint 105 forms a shallow depth or length in pre-etched cavity 281 due to buried insulator layer 128 acting as an etch stop for isolation trench 121 in top layer 129.

Figure 31:
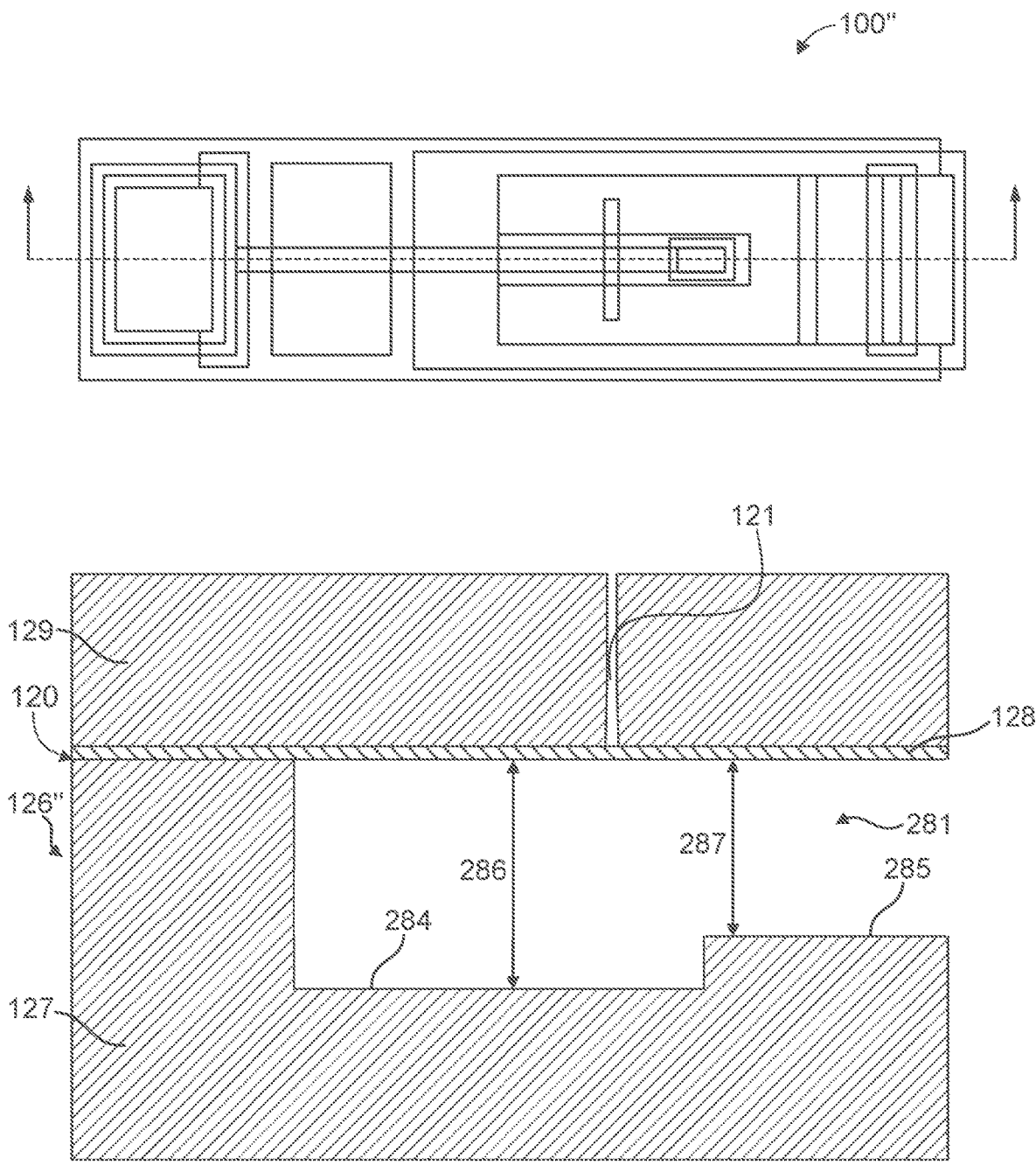
FIGS. 31-35 are schematic top view and cross-sectional view illustrations of an exemplary method of making a MEMS device on a cavity SOI substrate, according to exemplary embodiments.
Figure 34:
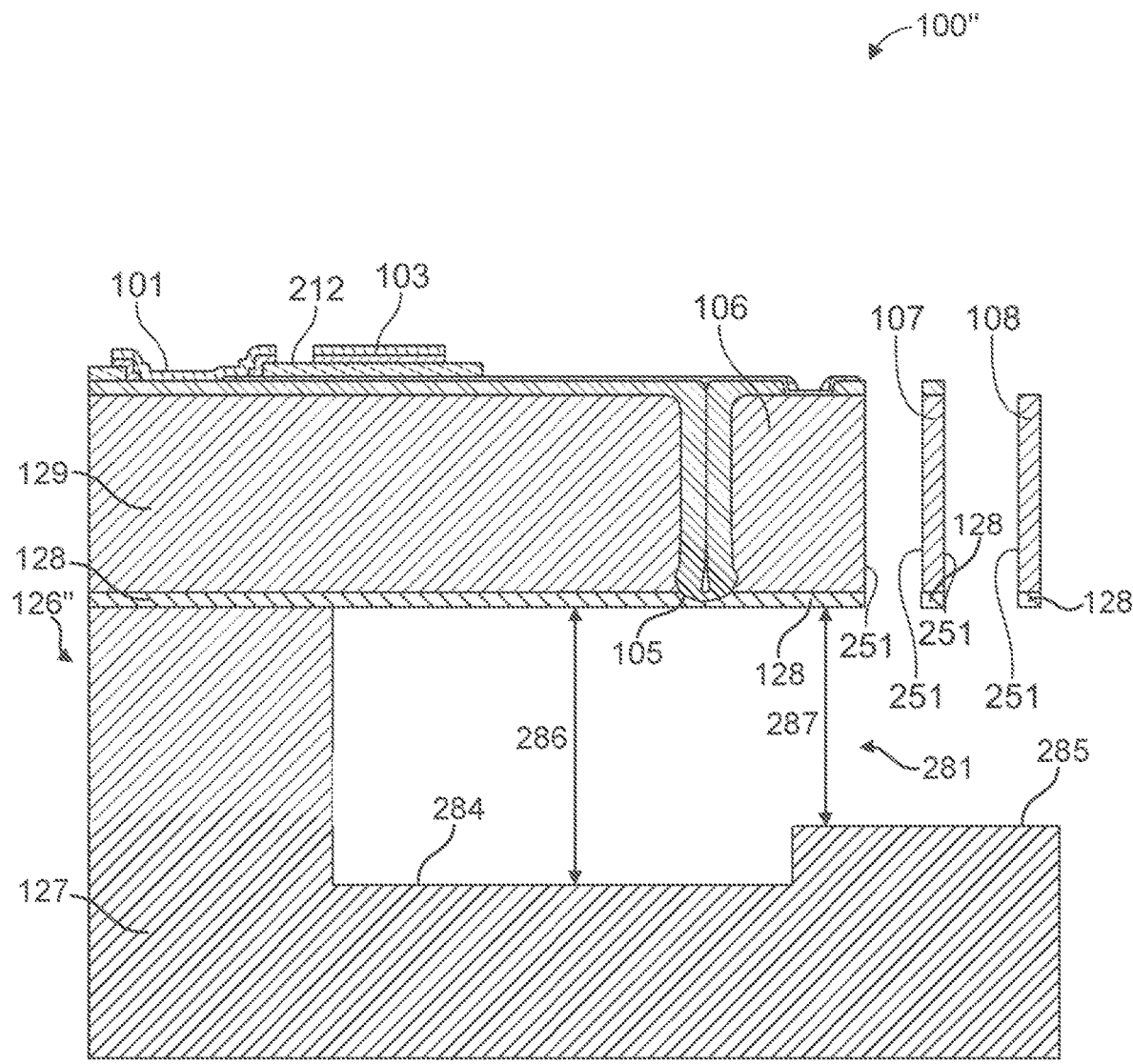

In FIG. 31 (Step A), isolation trench 121 can be formed in cavity SOI substrate 126". Cavity SOI substrate 126" can include a pre-etched cavity 281, for example, a rectangular void, disposed between a buried insulator layer 128 and a bulk (bottom) layer 127, and buried insulator layer 128, for example, silicon dioxide, disposed between an active (top) layer 129 and pre-etched cavity 281 and bottom layer 127. For example, cavity SOI substrate 126" can undergo patterning, etching, insulating, and bonding to form pre-etched cavity 281 and buried insulator layer 128 (e.g., pattern cavities in wafer, etch wafer to form cavities, deposit or grow insulating layer, wafer bond insulating layer to cap wafer). Buried insulator layer 128, for example, can have a thickness of about 50 nm to about 500 nm. Any other suitable method can be used to form cavity SOI substrate 126", such as chemical vapor deposition (CVD), wafer bonding, seed methods, SMART CUT™ (Soitec), NANO-CLEAVE® (Silicon Genesis), ELTRAN® (Canon), or C-SOI® (Okmetic). In some embodiments, buried insulator layer 128 can be configured to define a depth of isolation joint 105 of cavity SOI substrate 126" in cavity 281. For example, as shown in FIG. 31, buried insulator layer 128 can define or limit a depth of isolation trench 121 (e.g., act as an etch stop) that defines or limits a depth of isolation joint 105 in cavity 281, for example, as shown in FIG. 34. In some embodiments, as shown in FIG. 31, pre-etched cavity 281 can be disposed below buried insulator layer 128. In some embodiments, cavity SOI substrate 126" can include a plurality of pre-etched cavities, each similar to pre-etched cavity 281, of varying shapes and depths. For example, a first pre-etched cavity of a first volume can be disposed in cavity SOI substrate 126" in a first device region and be configured for a first MEMS device, and a second pre-etched cavity of a second volume can be disposed in cavity SOI substrate 126" in a second device region and be configured for a second MEMS device.

Figure 35:
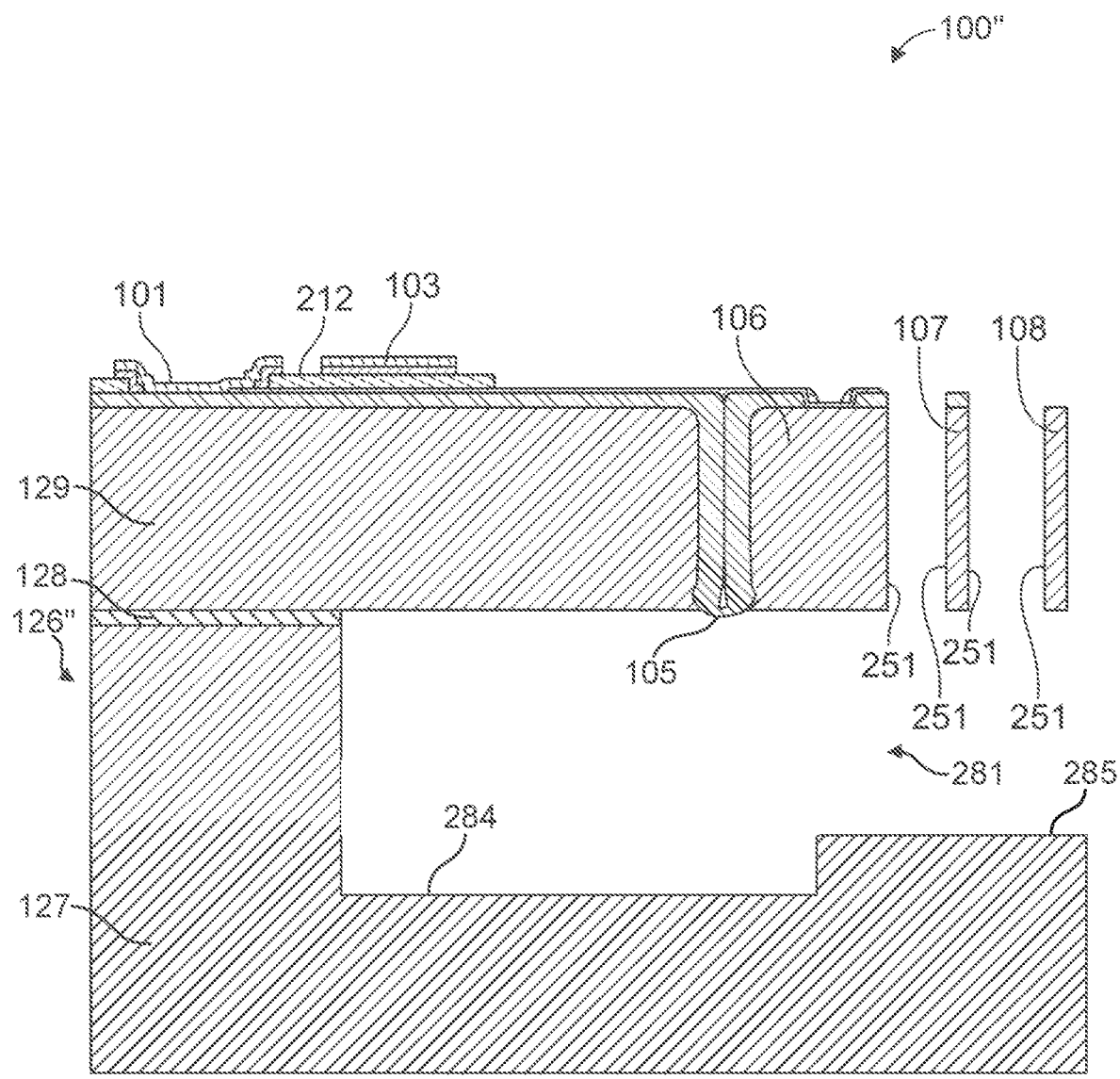

In some embodiments, pre-etched cavity 281 can include a plurality of depths. For example, as shown in FIG. 31, pre-etched cavity 281 can include a first cavity depth 286 between a bottom of buried insulator layer 128 and floor 284, and a second cavity depth 287 between the bottom of buried insulator layer 128 and a second floor 285 (e.g., lower bump stop). In some embodiments, pre-etched cavity 281 can include a uniform depth, for example, first cavity depth 286. In some embodiments, first cavity depth 286 can be about 1 μm to about 50 μm. In some embodiments, second cavity depth 287 can be about 1 μm to about 50 μm. In some embodiments, second cavity depth 287 can be equal to first cavity depth 286 for a uniform cavity. In some embodiments, first cavity depth 286 and second cavity depth 287 can have different depths. In some embodiments, second cavity depth 287 can be less than first cavity depth 286. For example, as shown in FIG. 31, second cavity depth 287 can define second floor 285 that is raised vertically relative to floor 284. In some embodiments, floor 284 and/or second floor 285 can act as a lower bump stop. For example, as shown in FIG. 35, second floor 285 can act as a lower bump stop for beams 106, 107, and/or 108.

In an embodiment, isolation trench 121 can be formed in top layer 129 of cavity SOI substrate 126". An isolation trench pattern can be transferred to cavity SOI substrate 126" to form isolation trench 121 where isolation joint 105 will be formed. Isolation trench 121 can have any suitable profile, for example, a reentrant profile in which the top is narrower than the bottom, such as illustrated in FIG. 31. An embodiment includes a profile that monotonically increases in width. As shown in FIG. 31, isolation trench 121 can be disposed above buried insulator layer 128. In some embodiments, isolation trench 121 can extend to buried insulator layer 128, which can act as an etch stop. In an example, top layer 129 can be silicon and etched using an anisotropic silicon extension etch. The depth of isolation trench 121 can extend to buried insulator layer 128, which can act as an etch stop, for example, an anisotropic silicon etch stop.

Figure 32:
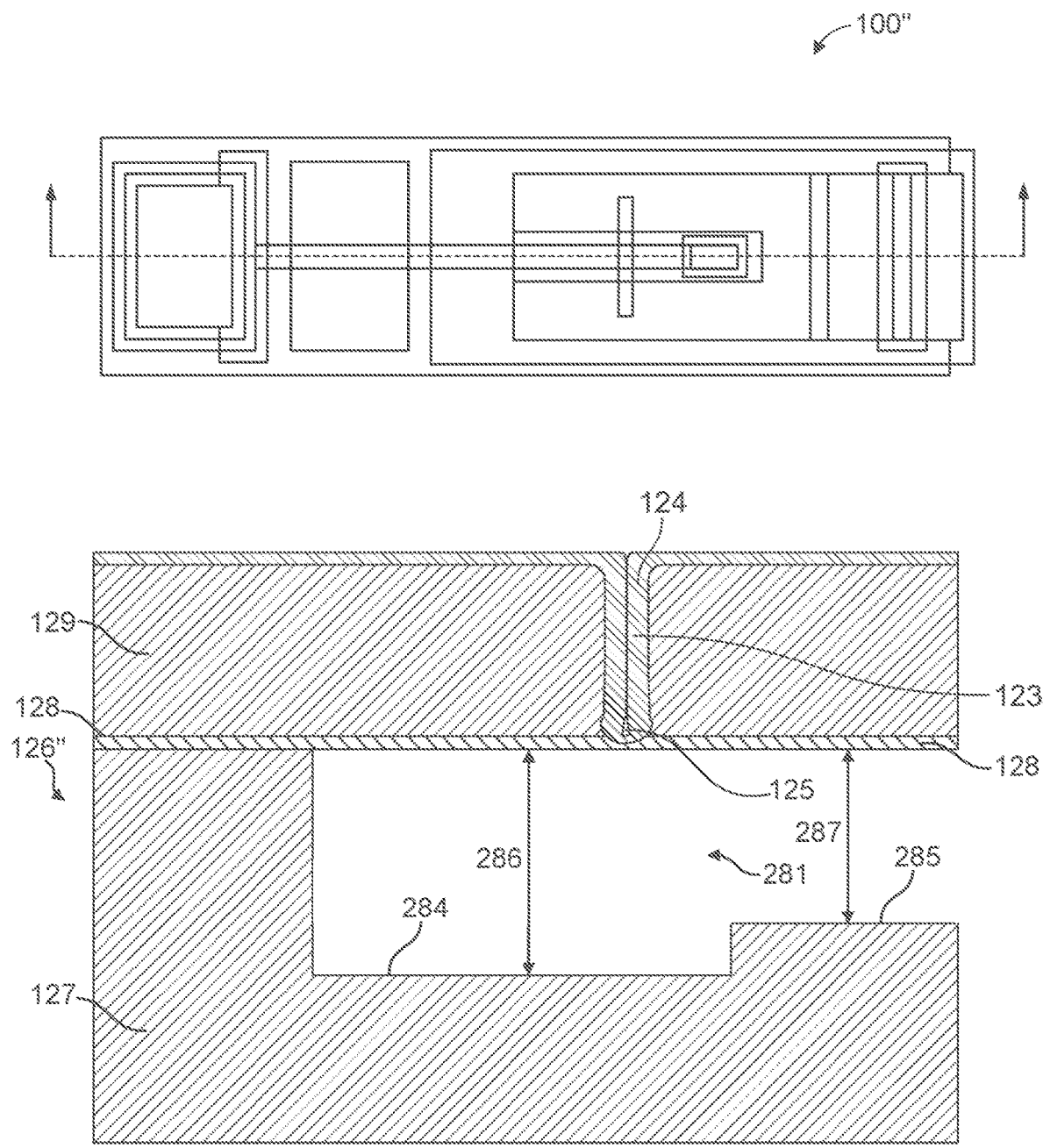

As illustrated in FIG. 32 (Step B), isolation trench 121 can be filled with a first dielectric layer 123, for example, silicon dioxide or any other suitable dielectric material. In an embodiment, cavity SOI substrate 126" can include silicon and top layer 129 can be thermally oxidized to form a layer of silicon dioxide. Top layer 129 can be oxidized at about 1100° C. to about 1200° C. with wet oxidation to form silicon dioxide having a thickness of about 1.5 μm to about 2.5 μm. An opening 124 of isolation trench 121 can be sealed, and a void 125 can remain after the oxidization process. In some embodiments, as shown in FIG. 32, during filling isolation trench 121 with first dielectric layer 123, first dielectric layer 123 can extend to buried insulator layer 128 and/or pre-etched cavity 281. For example, buried insulator layer 128 can form silicon dioxide from thermal oxidation or annealing.

In the interest of brevity, Steps C through M will not be described.

Figure 33:
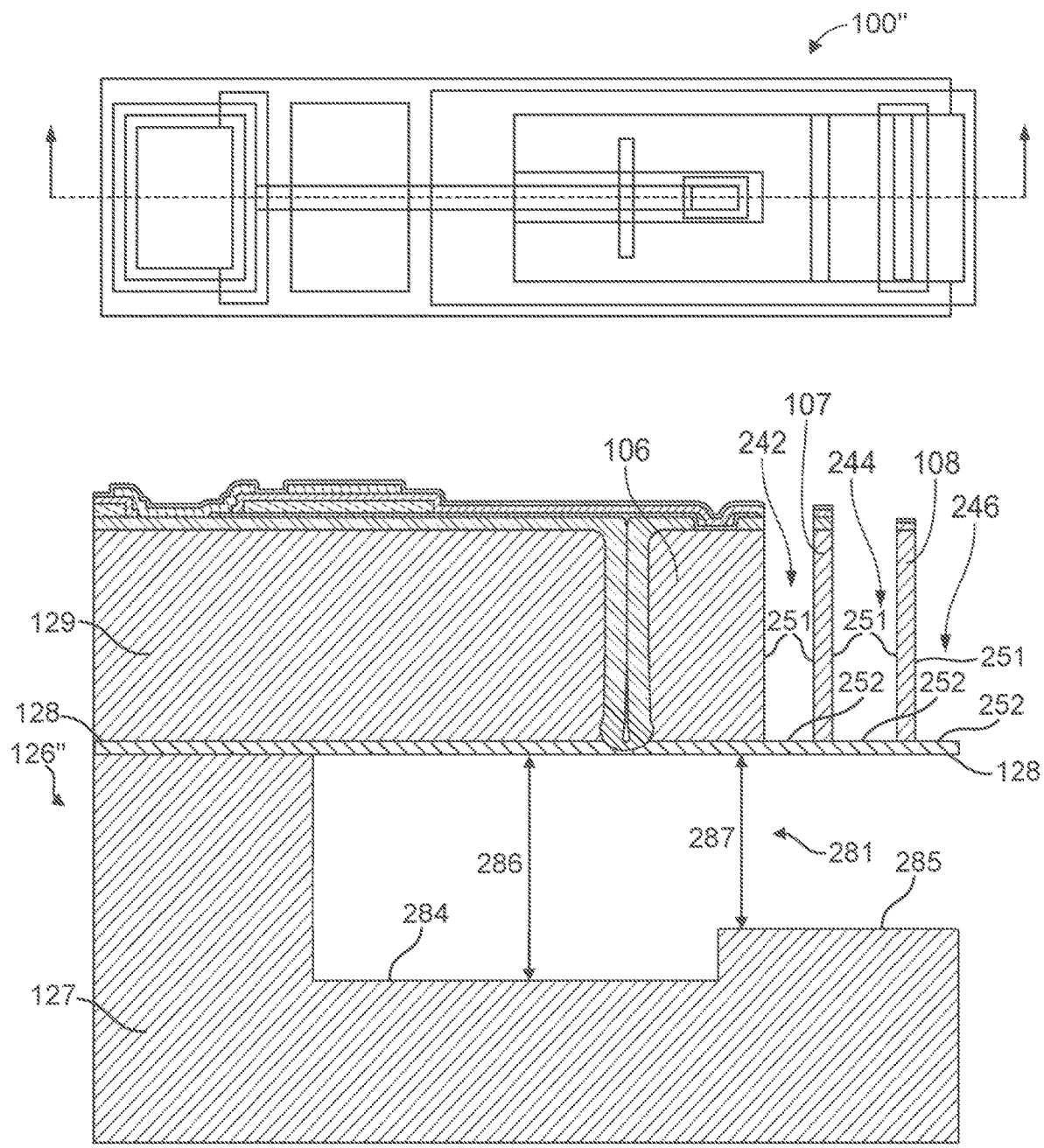

As shown in FIG. 33 (Step N), top layer 129 of cavity SOI substrate 126" can be patterned and etched to create at least one trench that can define a profile of a beam. For example, trenches 242, 244, and 246 can be formed in top layer 129 to define the profiles of beams 106, 107, and 108. In one embodiment, trenches 242, 244, and 246 can be formed by using any suitable lithographic technique, for example, photolithography, and a series of dry etching steps that etch third dielectric passivation layer 230, second dielectric passivation layer 190, first dielectric layer 123, and top layer 129. In one example, a standard plasma dry etch using $CHF_3$ and $O_2$ can be used to etch third dielectric passivation layer 230, second dielectric passivation layer 190, and first dielectric layer 123. In an embodiment, top layer 129 can be etched using a silicon etch chamber running the Bosch process. In another embodiment, metal trace 104 can be etched if metal trace 104 is within the masking stack. In another embodiment, any residue remaining from etching third dielectric passivation layer 230, second dielectric passivation layer 190, first dielectric layer 123, and top layer 129 can be removed.

The depth of trenches 242, 244, and 246 in top layer 129 can extend to buried insulator layer 128, which can act as an etch stop, for example, an anisotropic silicon etch stop. In an example, top layer 129 can be silicon and buried insulator layer 128 can be silicon dioxide or silicon nitride, and top layer 129 can be etched down to buried insulator layer 128 by anisotropic wet silicon etching (e.g., potassium hydroxide (KOH), ethylene diamine pyrocatechol (EDP), tetramethylammonium hydroxide (TMAH), etc.) or anisotropic dry silicon etching (e.g. plasma etching, reactive ion etching (ME), deep reactive ion etching (DRIE), $CCl_4$ etching, $Cl_2$ etching, $CCl_2F_2$ etching, etc.). In one example, the depth of trenches 242, 244, and 246 can be about 1 μm to about 30 μm. The depth, however, can vary depending on the desired height of the beams 106, 107, and 108.

Steps O and P, deposition and subsequent removal of portions of second dielectric layer 250 formed on trench floors 252 and sidewalls 251 are unnecessary in this method because of buried insulator layer 128 and pre-etched cavity 281.

Next as shown in FIG. 34 (Step Q), the portions of buried insulator layer 128 can be removed in a release etch step. For example, second dielectric layer 250 and buried insulator layer 128 can be an oxide and trench floors 252 and second dielectric layer 250 on sidewalls 251 can be removed with an anisotropic dry oxide etch, exposing pre-etched cavity 281. FIG. 34 shows MEMS device 100" after the release etch, for example, a dry anisotropic silicon dioxide release etch, such as a plasma etch using $CHF_3$ and $O_2$. The release etch can free beams 106, 107, and 108 from buried insulator layer 128 and expose pre-etched cavity 281 that separates beams 106, 107, and 108 from a floor 284 of bottom layer 127 of cavity SOI substrate 126", thereby allowing beams 106, 107, and 108 to flex or move during operation of MEMS device 100".

Step R, release etch from bottom layer 127 is unnecessary in this method because of pre-etched cavity 281.

In one embodiment, portions of buried insulator layer 128 formed on bottoms of beams 106, 107, and 108 and a bottom of top layer 129 in pre-etched cavity 281 by an etch step, as shown in FIG. 35 (Step S). For example, buried insulator layer 128 can be removed during the etch step to remove any dielectric (e.g., oxide, nitride) from a bottom surface of beams 106, 107, and 108 and a bottom of top layer 129. Removing these portions of buried insulator layer 128 on bottoms of beams 106, 107, and 108 and an exposed bottom of top layer 129 can be advantageous. As discussed above, if there is a dielectric layer on a bottom of beams 106, 107, and 108 of cavity SOI substrate 126", electrical charges can develop in the bottom coatings when the beams contact each other during operation of MEMS device 100". By removing buried insulator layer 128 in pre-etched cavity 281, the bottom surface of beams 106, 107, and 108 can comprise a semiconductor, e.g., silicon, and not a dielectric material. Accordingly, any electrical charges created from beam contact can dissipate quickly, which can help prevent an unwanted force from being applied to the beams. In an embodiment, the HF vapor etch can be controlled so that etching of isolation joint 105 can be reduced. If the HF vapor etch is uncontrolled, isolation joint 105 can be weakened since it can comprise silicon dioxide like, for example, buried insulator layer 128. However, isolation joint 105 can be made from thermal oxide, and isolation joint 105 can etch at a slower rate than buried insulator layer 128.

In another embodiment, second dielectric passivation layer 190 can be removed from top layer 129 during the etch step, for example, an HF vapor etch, exposing metal bond pad 101 and gap 212 around metal seal ring surface 103. This removal can allow for wire bonding with metal bond pad 101 and a lid to seal with metal seal ring surface 103. In another embodiment, second dielectric passivation layer 190 on top of beams 107 and 108 can be removed during the etch step, for example, an HF vapor etch.

In one embodiment, the thickness of second dielectric passivation layer 190 and/or buried insulator layer 128 can be minimized to reduce the etching of the isolation joint 105 during the HF vapor etch. For example, the thickness of second dielectric passivation layer 190 and/or buried insulator layer 128 can be less than about 450 nm, and preferably less than about 400 nm. Any thickness below about 450 nm can minimize the etching effect on isolation joint 105. In another embodiment, an anti-stiction coating can be applied to help prevent beams 106, 107, and 108 from sticking during operation of MEMS device 100".

In the interest of brevity, Steps T and U will not be described.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific embodiments of the disclosure have been described above, it will be appreciated that the disclosure may be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

What is claimed is:

1. A micro-electromechanical system (MEMS) device comprising:
    a substrate comprising a buried insulator layer and a cavity; and
    a beam suspended relative to a surface of the substrate, the beam comprising a first portion and a second portion that are separated by an isolation joint,
    wherein the cavity separates the surface of the substrate from the beam,
    wherein the substrate comprises a semiconductor-on-insulator (SOI) substrate, and
    wherein the buried insulator layer is configured to define the surface of the substrate forming the cavity.

2. The MEMS device of claim 1, wherein the substrate comprises a second buried insulator layer.

3. The MEMS device of claim 2, wherein the second buried insulator is configured to define a depth of the isolation joint in the cavity.

4. The MEMS device of claim 2, wherein the buried insulator layer and the second buried insulator layer define the cavity.

5. The MEMS device of claim 1, wherein the buried insulator layer is configured to define a depth of the isolation joint in the cavity.

6. The MEMS device of claim 1, wherein the cavity is a pre-etched cavity.

7. The MEMS device of claim 6, wherein the pre-etched cavity is disposed below the buried insulator layer.

8. The MEMS device of claim 7, wherein the pre-etched cavity comprises a plurality of depths.

9. The MEMS device of claim 1, wherein:
    the first and second portions each comprise a semiconductor and a dielectric layer; and
    an electrically conductive trace is mechanically coupled to the beam and electrically coupled to the semiconductor of the second portion but not the semiconductor of the first portion.

10. The MEMS device of claim 9, further comprising a second beam suspended relative to the surface of the substrate, the second beam comprising a second dielectric layer configured to promote curvature of the second beam.

11. The MEMS device of claim 10, further comprising a third beam suspended relative to the surface of the substrate.

12. The MEMS device of claim 11, wherein the second beam is configured to move relative to the third beam in response to an acceleration along an axis perpendicular to the surface of the substrate.

13. A handheld device comprising:
    a micro-electromechanical system (MEMS) device, comprising:
        a substrate comprising a buried insulator layer and a cavity; and
        a beam suspended relative to a surface of the substrate, the beam comprising a first portion and a second portion that are separated by an isolation joint,
        wherein the cavity separates the surface of the substrate from the beam,
        wherein the substrate comprises a semiconductor-on-insulator (SOI) substrate, and
        wherein the buried insulator layer is configured to define the surface of the substrate forming the cavity.

14. The handheld device of claim 13, wherein the substrate comprises a second buried insulator layer.

15. The handheld device of claim 13, wherein the cavity is a pre-etched cavity.

16. A micro-electromechanical system (MEMS) device comprising:
    a semiconductor-on-insulator (SOI) substrate comprising:
        a first buried insulator layer;
        a second buried insulator layer; and
        a cavity between the first and second buried insulator layers; and
    a beam suspended relative to a surface of the SOI substrate, the beam comprising a first portion and a second portion that are separated by an isolation joint,
    wherein the cavity separates the surface of the SOI substrate from the beam.

17. The MEMS device of claim 16, wherein the first buried insulator layer is configured to define the surface of the SOI substrate forming the cavity.

18. The MEMS device of claim 16, wherein the second buried insulator is configured to define a depth of the isolation joint in the cavity.

19. The MEMS device of claim 16, wherein the first buried insulator layer defines a lower portion of the cavity and the second buried insulator layer defines an upper portion of the cavity.

20. The MEMS device of claim 16, wherein the SOI substrate comprises silicon.

* * * * *